United States Patent

Sugimoto

(10) Patent No.: US 12,417,793 B2
(45) Date of Patent: Sep. 16, 2025

(54) SEMICONDUCTOR STORAGE DEVICE

(71) Applicant: Kioxia Corporation, Tokyo (JP)

(72) Inventor: Takahiro Sugimoto, Yokohama (JP)

(73) Assignee: Kioxia Corporation, Tokyo (JP)

( * ) Notice: Subject to any disclaimer, the term of this patent is extended or adjusted under 35 U.S.C. 154(b) by 150 days.

(21) Appl. No.: 18/491,849

(22) Filed: Oct. 23, 2023

(65) Prior Publication Data

US 2024/0233790 A1 Jul. 11, 2024

(30) Foreign Application Priority Data

Oct. 25, 2022 (JP) ................................. 2022-170786

(51) Int. Cl.
G11C 7/22 (2006.01)
G11C 7/06 (2006.01)

(52) U.S. Cl.
CPC ................ *G11C 7/222* (2013.01); *G11C 7/06* (2013.01)

(58) Field of Classification Search
CPC ...................................................... G11C 7/222
USPC ........................................................ 365/233.1
See application file for complete search history.

(56) References Cited

U.S. PATENT DOCUMENTS

| | | | |
|---|---|---|---|
| 6,201,423 B1* | 3/2001 | Taguchi | G11C 7/1006 327/144 |
| 6,317,377 B1* | 11/2001 | Kobayashi | G11C 7/1006 365/220 |
| 7,084,688 B2 | 8/2006 | McClure | |
| 2004/0047220 A1* | 3/2004 | Itoh | G11C 7/225 365/222 |

* cited by examiner

*Primary Examiner* — Muna A Techane
(74) *Attorney, Agent, or Firm* — Oblon, McClelland, Maier &Neustadt, L.L.P.

(57) ABSTRACT

According to one embodiment, a semiconductor storage device includes a sense amplifier, an input/output circuit, and a control signal transmission circuit. A first clock wiring line, a second clock wiring line extending along one side surface of the first clock wiring line, and a third clock wiring line extending along the other side surface of the first clock wiring line are connected to the control signal transmission circuit. The control signal transmission circuit outputs a first clock signal to the first clock wiring line, and outputs a second clock signal having a phase being reverse-phase to the first clock signal to the second clock wiring line and the third clock wiring line. A reception-side circuit captures the data signal in response to a delay clock signal output from a clock delay circuit.

8 Claims, 20 Drawing Sheets

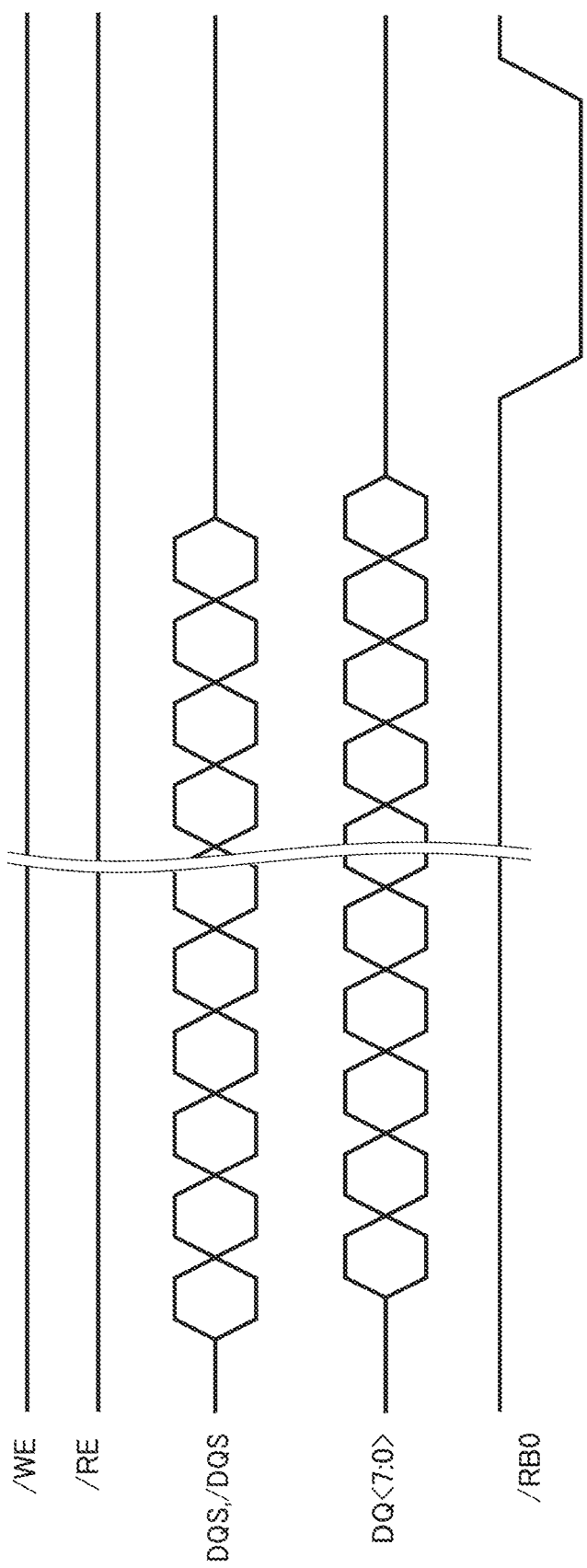

SEMICONDUCTOR STORAGE DEVICE

CROSS-REFERENCE TO RELATED APPLICATIONS

This application is based upon and claims the benefit of priority from prior Japanese Patent Application P2022-170786 filed on Oct. 25, 2022; the entire contents of which are incorporated by reference herein.

FIELD

Embodiments described herein relate generally to a semiconductor storage device.

BACKGROUND

In a semiconductor storage device, circuit blocks arranged on a substrate are connected by a signal wiring line through which a data signal propagates (hereinafter, also referred to as a "data wiring line"). As the speed of operation of the semiconductor storage device is increased, the number of data wiring lines arranged adjacent to each other in parallel is also increased. When the interval between the data wiring lines is reduced, the propagation speed of the data signals through the data wiring lines varies due to capacitive coupling between the data wiring lines. As a result, a width of a valid window on the circuit blocks, which receives the data signals propagating through the plurality of data wiring lines, is reduced, and it is challenging to adjust a clock signal for capturing the data signals accurately.

BRIEF DESCRIPTION OF THE DRAWINGS

FIG. 3B is an example of a command sequence relating to the write operation of the non-volatile memory.

DETAILED DESCRIPTION

According to one embodiment, a semiconductor storage device includes a sense amplifier connected to a memory cell array, an input/output circuit, a control signal transmission circuit, and a plurality of data wiring lines for connecting the input/output circuit and the sense amplifier to each other. A first clock wiring line, a second clock wiring line extending along one side surface of the first clock wiring line, and a third clock wiring line extending along the other side surface of the first clock wiring line are connected to the control signal transmission circuit. When a data signal is transmitted/received via the data wiring lines between the input/output circuit and the sense amplifier, the control signal transmission circuit outputs a first clock signal to the first clock wiring line, and outputs a second clock signal having a phase being reverse-phase to the first clock signal to the second clock wiring line and the third clock wiring line. A reception-side circuit that receives the data signal captures the data signal in response to a delay clock signal output from a clock delay circuit that delays the first clock signal.

Next, with reference to the drawings, embodiments are described. In the description of the drawings given below, the same or similar portions are denoted with the same or similar reference symbols. The drawings are schematic. Further, the embodiments described below illustrate devices and methods for concretizing the technical concept, and do not specify materials, shapes, structures, arrangement, and the like of the components. Various modifications may be made to the embodiments.

First Embodiment

Figure 1:
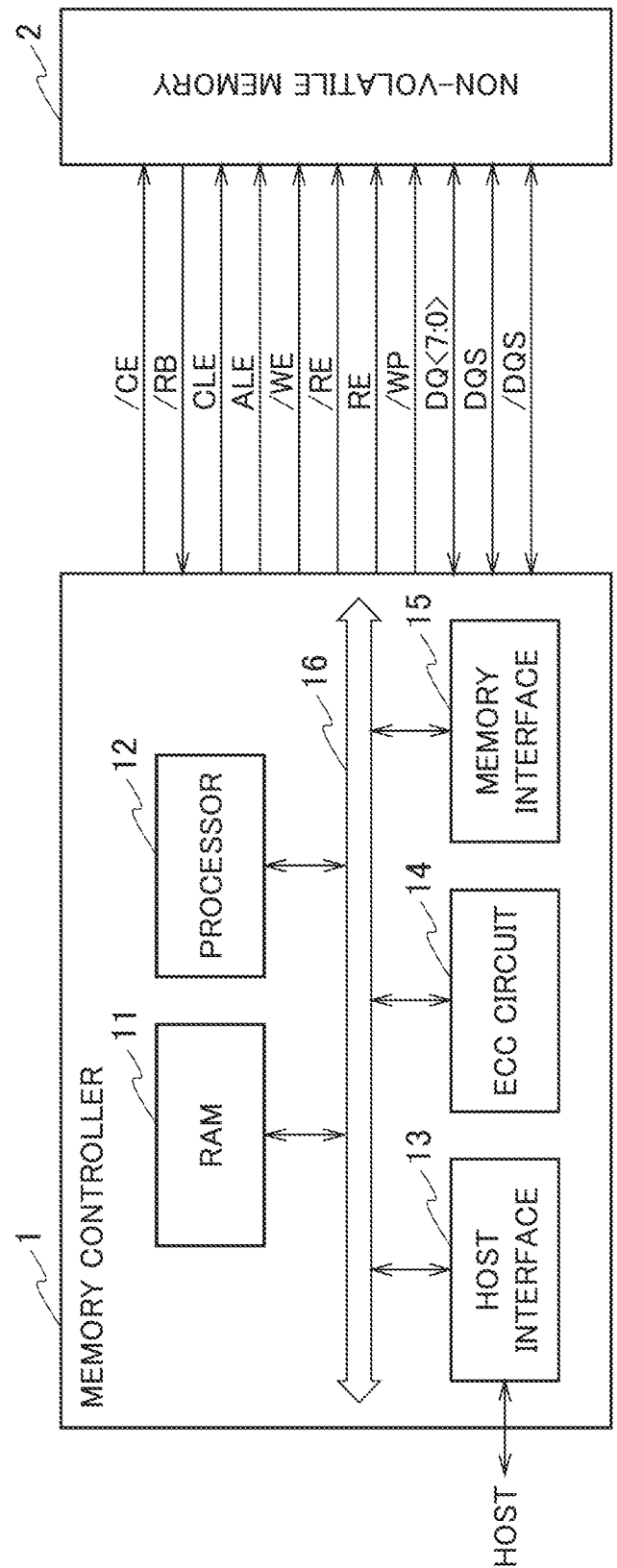
FIG. 1 is a block diagram illustrating a configuration of a memory system including a semiconductor storage device according to a first embodiment.

A semiconductor storage device according to a first embodiment of the present invention is applicable to a non-volatile memory 2 included in a memory system illustrated in FIG. 1, for example. The non-volatile memory 2 is a semiconductor memory that stores data in a non-volatile manner. For example, the non-volatile memory 2 includes a NAND flash memory. A memory controller 1 controls an operation of the non-volatile memory 2. A host is an electronic apparatus such as a personal computer and a mobile terminal.

First, the memory system illustrated in FIG. 1 is described. Note that, in the following description, a signal DQ<7:0> indicates a set of signals DQ<0>, DQ<1>, . . . , and DQ<7>, each of which is a 1-bit signal. The signal DQ<7:0> is an 8-bit signal.

The memory controller 1 receives an instruction from the host, and controls the non-volatile memory 2, based the received instruction. Specifically, the memory controller 1 is instructed from the host to write data in the non-volatile memory 2, and is instructed from the host to read data from the non-volatile memory 2 and transmit the data to the host. A non-volatile memory cell being a writing target in the non-volatile memory 2 is designated by the memory controller 1. In the following description, the non-volatile memory cell of the non-volatile memory 2 is also referred to as a "memory cell".

The memory controller 1 and the non-volatile memory 2 perform transmission and reception of a signal in conformity with interface standards of the memory controller 1 and the non-volatile memory 2, via an individual signal line. Examples of the signal transmitted/received between the memory controller 1 and the non-volatile memory 2 include signals /CE, /RB, CLE, ALE, /WE, /RE, RE, /WP, DQC<7:0>, DQS, /DQS, and the like.

The signal /CE is a chip enable signal for enabling the non-volatile memory 2. The signal /RB is a ready/busy signal for indicating whether the non-volatile memory 2 is in a ready state (a state of receiving an instruction from the outside) or a busy state (a state of not receiving an instruction from the outside). The signal CLE is a command latch enable signal for notifying the non-volatile memory 2 that the signal DQ<7:0> transmitted to the non-volatile memory 2 while the signal CLE is at a high (1H) level is a command. The signal ALE is an address latch enable signal for notifying the non-volatile memory 2 that the signal DQ<7:0> transmitted to the non-volatile memory 2 while the signal ALE is at the H level is an address. The signal /WE is a write enable signal for instructing the signal DQ<7:0> transmitted to the non-volatile memory 2 to be captured in the non-volatile memory 2. In a single data rate (SDR) mode, capturing the signal DQ<7:0> as a command, an address, or data that is transmitted to the non-volatile memory 2 at a rising edge of the signal /WE is instructed. Further, in a double data rate (DDR) mode, capturing the signal DQ<7:0> as a command or an address that is transmitted to the non-volatile memory 2 at a rising edge of the signal /WE is instructed. The signal /WE is asserted by the memory controller 1 each time the non-volatile memory 2 receives a command, an address, and data.

The signal IRE is a read enable signal for instructing the memory controller 1 to read the signal DQ<7:0> from the non-volatile memory 2. The signal RE is a complementary signal of the signal /RE. For example, the signals /RE and RE are used to control timing at which the non-volatile memory 2 outputs the signal DQ<7:0>. More specifically, in a single data rate mode, the non-volatile memory 2 is instructed to output the signal DQ<7:0> as data at a falling edge of the signal /RE. Further, in a double data rate mode, the non-volatile memory 2 is instructed to output the signal DQ<7:0> as data at a falling edge and a rising edge of the signal /RE. The signal /WP is a write protect signal for instructing the non-volatile memory 2 to disable data writing.

The signal DQ<7:0> is data entity transmitted/received between the non-volatile memory 2 and the memory controller 1. The signal DQ<7:0> includes a command CMD, an address ADD, and data DAT. The data DAT includes data written in the non-volatile memory (hereinafter, also referred to as "write data") and data read from the non-volatile memory (hereinafter, also referred to as "read data"). The signal DQS is a data strobe signal used for controlling operation timing of the non-volatile memory 2, which relates to the signal DQ<7:0>. The signal /DQS is a complementary signal of the signal DQS. The signals DQS and /DQS are generated based on the signals RE and /RE, for example. More specifically, in a double data rate mode, the non-volatile memory 2 is instructed to capture the signal DQ<7:0> as data at a falling edge and a rising edge of the signal DQS. Further, in a double data rate mode, the signal DQS is generated based on a falling edge and a rising edge of the signal /RE, and is output together with the signal DQ<7:0> as data from the non-volatile memory 2.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to one another via a bus 16.

The RAM 11 temporarily stores data received from the host until the non-volatile memory 2 stores the data, or temporarily stores data read from the non-volatile memory 2 until the data is transmitted to the host. The RAM 11 is a general semiconductor memory such as a static random access memory (SRAM) and a dynamic random access memory (DRAM).

The processor 12 control an operation of the entire memory controller 1. The processor 12 is a central processing unit (CPU), a micro processing unit (MPU), or the like. For example, the processor 12 issues a reading command to the non-volatile memory 2, in response to a command of reading data received from the host. The operation is also similar in a case of data writing. The processor 12 determines a storage region (memory region) of the non-volatile memory 2, with respect to data accumulated in the RAM 11. Further, the processor 12 includes a function of executing various arithmetic operations with respect to data read from the non-volatile memory 2.

The host interface 13 is connected to the host, and executes processing in conformity with an interface standard with the host. For example, the host interface 13 transfers a command and data that are received from the host, to the processor 12. Further, the host interface 13 transmits data read from the non-volatile memory 2, a response from the processor 12, and the like to the host.

The ECC circuit 14 encodes the data stored in the RAM 11 to generate codewords. Further, the ECC circuit 14 decodes codewords read from the non-volatile memory 2.

The memory interface 15 is connected to the non-volatile memory 2 via the bus, and executes communication with the non-volatile memory 2. The memory interface 15 is instructed by the processor 12 to transmit the command CMD, the address ADD, and the write data to the non-volatile memory 2. Further, the memory interface 15 receives the read data from the non-volatile memory 2.

FIG. 1 illustrates a configuration example in which the memory controller 1 includes the ECC circuit 14 and the memory interface 15 individually. However, the ECC circuit 14 may be embedded in the memory interface 15. Further, the ECC circuit 14 may be embedded in the non-volatile memory 2.

When a write command is received from the host, the memory system operates in the following manner. The processor 12 causes the RAM 11 to temporarily store data instructed to be written. The processor 12 reads the data stored in the RAM 11, and inputs data into the ECC circuit 14. The ECC circuit 14 encodes the input data, and inputs codewords into the memory interface 15. The memory interface 15 write the input codewords into the non-volatile memory 2.

When a read command is received from the host, the memory system operates in the following manner. The memory interface 15 inputs codewords read from the non-volatile memory 2, into the ECC circuit 14. The ECC circuit 14 decodes the input codewords, and stores the decoded data in the RAM 11. The processor 12 transmits the data stored in the RAM 11, to the host via the host interface 13.

Figure 2:
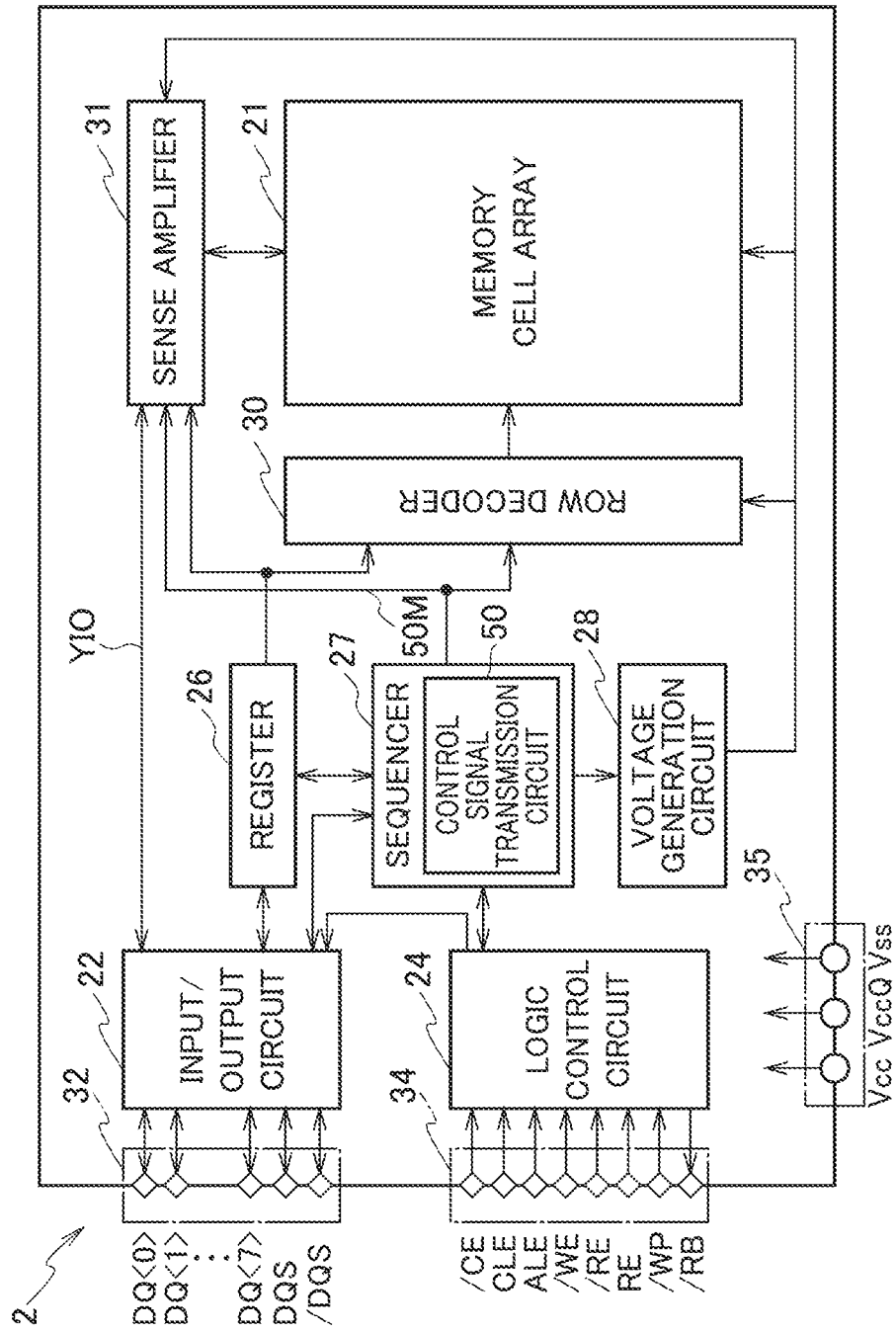
FIG. 2 is a block diagram illustrating a configuration of the semiconductor storage device according to the first embodiment.

FIG. 2 is a block diagram illustrating a configuration example of the non-volatile memory 2. The non-volatile memory 2 includes a memory cell array 21, an input/output circuit 22, a logic control circuit 24, a register 26, a sequencer 27, a voltage generation circuit 28, a row decoder 30, a sense amplifier 31, and a control signal transmission circuit 50. The non-volatile memory 2 further includes an input/output pad group 32, a logic control pad group 34, and a power input terminal group 35.

The memory cell array 21 includes a plurality of memory cells (omitted in illustration) associated with word lines and bit lines.

The input/output circuit 22 transmits % receives the signal DQC<7:0> and the signals DQS and /DQS with the memory controller 1. The input/output circuit 22 transfers the command CMD and the address ADD in the signal DQ<7:0> to the register 26. Further, the input/output circuit 22 transmits/receives the write data and the read data with the sense amplifier 31.

The logic control circuit 24 receives the signals /CE, CLE, ALE, /WE, /RE, RE, /WP, and /RB from the memory controller 1. Further, the logic control circuit 24 transfers the signal /RB to the memory controller 1, and notifies the outside of a state of the non-volatile memory 2.

The register 26 stores the command CMD and the address ADD. The register 26 transfers the address ADD to the row decoder 30 and the sense amplifier 31, and transfers the command CMD to the sequencer 27.

The sequencer 27 receives the command CMD, and controls the entire non-volatile memory 2 by following a sequence based on the received command CMD. For example, the sequencer 27 supplies a control signal to the row decoder 30 and the sense amplifier 31 via a control signal wiring line 50M. For example, a plurality of control signal wiring lines 50M may be provided. In this case, various types of controls signals are supplied from the sequencer 27 to the row decoder 30 and/or the sense amplifier 31 via the plurality of control signal wiring lines 50M, respectively.

The voltage generation circuit 28 generates a voltage required for an operation such as data writing, data reading, and data removal, based on an instruction from the sequencer 27. Various voltages are supplied from the voltage generation circuit 28 to the row decoder 30, the sense amplifier 31, and the memory cell array 21, based on an address from the register 26.

The row decoder 30 receives a block address and a row address in the address ADD, from the register 26. The row decoder 30 selects a block, based on the block address, and selects a word line, based on the row address.

The sense amplifier 31 is connected to the memory cell array 21. At the time of reading data, the sense amplifier 31 senses the read data that is read from the memory cell to the bit line, and transfers the read data being sensed, to the input/output circuit 22. At the time of writing data, the sense amplifier 31 transfers the write data to the memory cell via the bit line.

Transfer of the data between the input/output circuit 22 and the sense amplifier 31 is performed via a data bus YIO. The data bus YIO includes a plurality of data wiring lines for connecting the input/output circuit 22 and the sense amplifier 31 to each other. The data written to the non-volatile memory 2 and the data read from the non-volatile memory 2 propagate through the data bus YIO.

The control signal transmission circuit 50 generates a clock signal used for an operation of the non-volatile memory 2, based on the signals /RE and RE supplied from the memory controller 1. In FIG. 2, the control signal transmission circuit 50 is illustrated as a part of the sequencer 27. However, for example, the control signal transmission circuit 50 may be configured as a part of the input/output circuit 22 and/or the logic control circuit 24. Further, the control signal transmission circuit 50 may be configured as a circuit different from the sequencer 27, the input/output circuit 22, and the logic control circuit 24.

The input/output pad group 32 includes a plurality of terminals (pads) corresponding to the signal DQ<7:0>, and the signals DQS and /DQS, in such a way that each signal including data is transmitted/received between the non-volatile memory 2 and the memory controller 1.

The logic control pad group 34 includes a plurality of terminals (pads) corresponding to the signals /CE, CLE, ALE, /WE, /RE, RE, /WP, and /RB, in such a way that each signal is transmitted/received between the non-volatile memory 2 and the memory controller 1.

The power input terminal group 35 includes a plurality of terminals through which power voltages Vcc and VccQ and a ground voltage Vss are input, in such a way that various types of operation power is supplied from the outside to the non-volatile memory 2. The power voltage Vcc is a circuit power voltage that is applied generally as operation power from the outside. For example, the power voltage Vcc is 2.5 V. The power voltage VccQ is used for transmitting/receiving a signal between the memory controller 1 and the non-volatile memory 2. For example, the power voltage VccQ is 1.2 V.

Figure 3A:
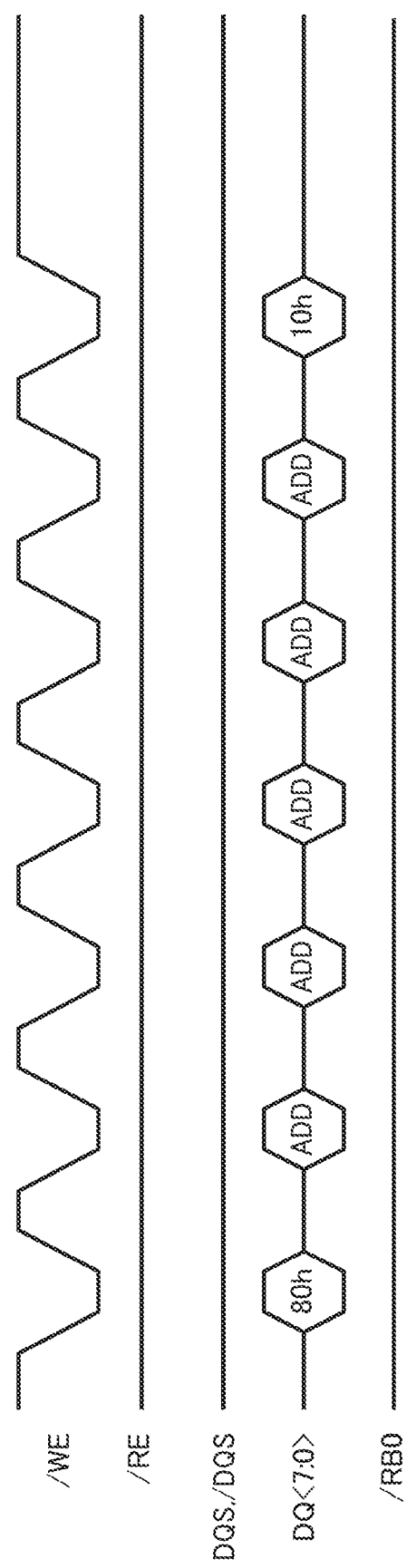
FIG. 3A is an example of a command sequence for instructing a write operation of a non-volatile memory.

FIG. 3A illustrates an example of a command sequence for instructing a write operation of the non-volatile memory 2 (in the following description, also referred to as a data-in operation). FIG. 3B illustrates an example of a command sequence relating to the data-in operation.

As illustrated in FIG. 3A, during the data-in operation, the memory controller 1 issues a command set to the non-volatile memory 2 to instruct the data-in operation, while toggling the signal /WE. For example, the command set for instructing the data-in operation includes a read command "80h", the addresses ADD for five cycles, and a command "10h". The read command "80h" is a command for writing data in a user data region in the memory cell array 21. The command "10h" is a command for starting the data-in operation.

As illustrated in FIG. 3I, after the command "10h", the memory controller 1 transfers data to be written in the memory cell array 21 as the signal DQ<7:0>, to the non-volatile memory 2. When the data to be written is transferred to the non-volatile memory 2, the memory controller 1 synchronizes the data with the signal DQ<7:0>, toggles the signals DQS and /DQS, and transfers the data to the non-volatile memory 2.

When the data to be written is received, the non-volatile memory 2 starts the write operation in the user data region in the memory cell array 21, changes the signal /RB to the L level, and notifies the memory controller 1 that the non-volatile memory 2 is in the busy state. After the write operation is completed, the non-volatile memory 2 changes the signal /RB to the H level, and notifies the memory controller 1 that the non-volatile memory 2 is in the ready state.

Figure 4A:
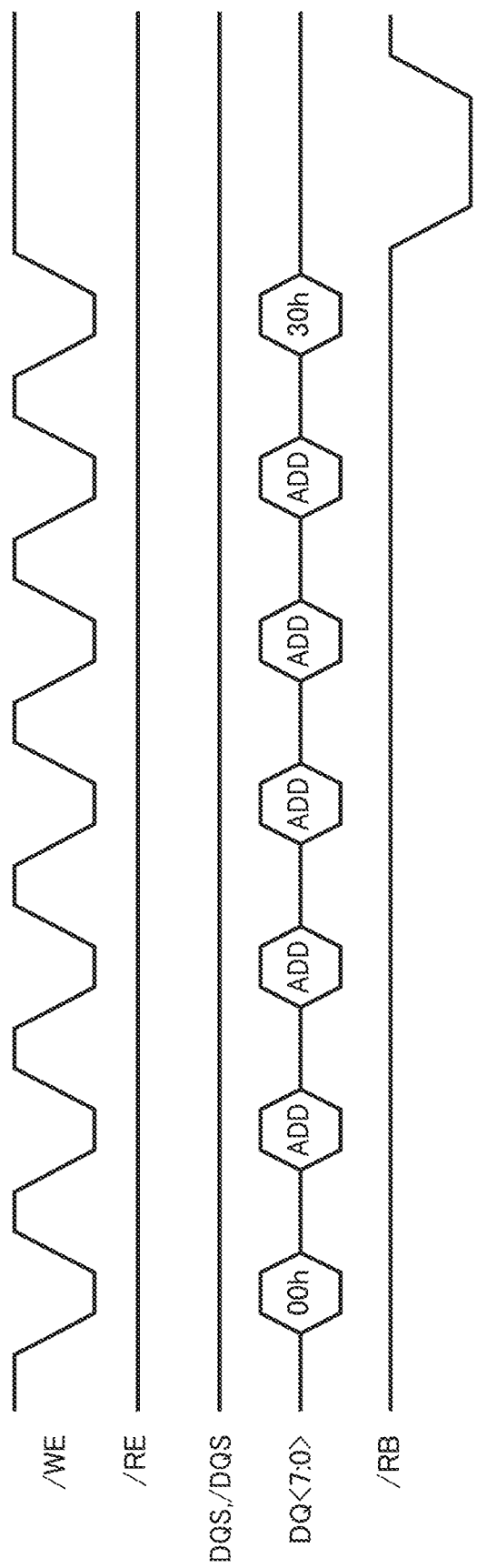
FIG. 4A is an example of a command sequence for instructing a read operation of the non-volatile memory.
Figure 4B:
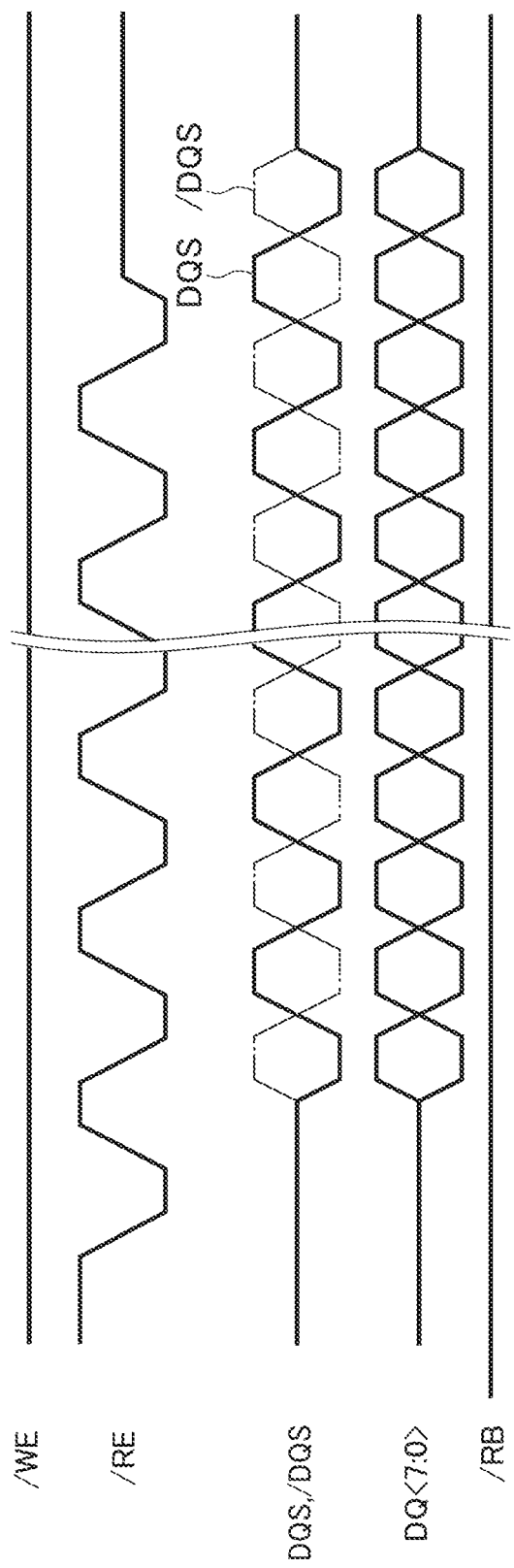
FIG. 4B is an example of a command sequence relating to the read operation of the non-volatile memory.

FIG. 4A illustrates an example of a command sequence for instructing a read operation of the non-volatile memory 2 (in the following description, also referred to as a "data-out operation"). FIG. 4B illustrates an example of a command sequence relating to the data-out operation.

As illustrated in FIG. 4A, during the data-out operation, the memory controller 1 issues a command set to the non-volatile memory 2 to instruct the data-out operation, while toggling the signal /WE. For example, the command set for instructing the data-out operation includes a read command "00h", the addresses ADD for five cycles, and a command "30h". The read command "00h" is a command for reading data from the memory cell array 21 of the non-volatile memory 2. The command "30h" is a command for starting the data-out operation. When the command "30h" is received, the non-volatile memory 2 starts the operation of reading the data from the memory cell array 21, changes the signal /RB to the L level, and notifies the memory controller 1 that the non-volatile memory 2 is in the busy state. After the read operation is completed, the non-volatile memory 2 changes the signal /RB to the H level, and notifies the memory controller 1 that the non-volatile memory 2 is in the ready state.

After it is confirmed that the non-volatile memory 2 is in the ready state, the memory controller 1 toggles the signals IRE and RE, as illustrated in FIG. 4B. The non-volatile memory 2 transfers the data, which is read in synchronization with the signals /RE and RE, as the signal DQ<7:0> to the memory controller 1. Further, the non-volatile memory 2 transfers the signals DQS and /DQS, which are toggled in synchronization with the signal DQ<7:0>, to the memory controller 1.

Note that, after it is confirmed that the non-volatile memory 2 is in the ready state, the memory controller 1 may issue a command set to the non-volatile memory 2 to instruct the data-out operation, while toggling the signal /WE. For example, the command set for instructing the data-out operation includes a data-out command "05h", the addresses ADD for five cycles, and a command "E0h". In this case, after a predetermined period elapses from transmission of the command "E0h" to the non-volatile memory 2, the memory controller 1 toggles the signals IRE and RE. The non-volatile memory 2 transfers the data, which is read in synchronization with the signals IRE and RE, as the signal DQ<7:0> to the memory controller 1. Further, the non-volatile memory 2 transfers the signals DQS and /DQS, which are toggled in synchronization with the signal DQ<7:0>, the memory controller 1.

Figure 5:
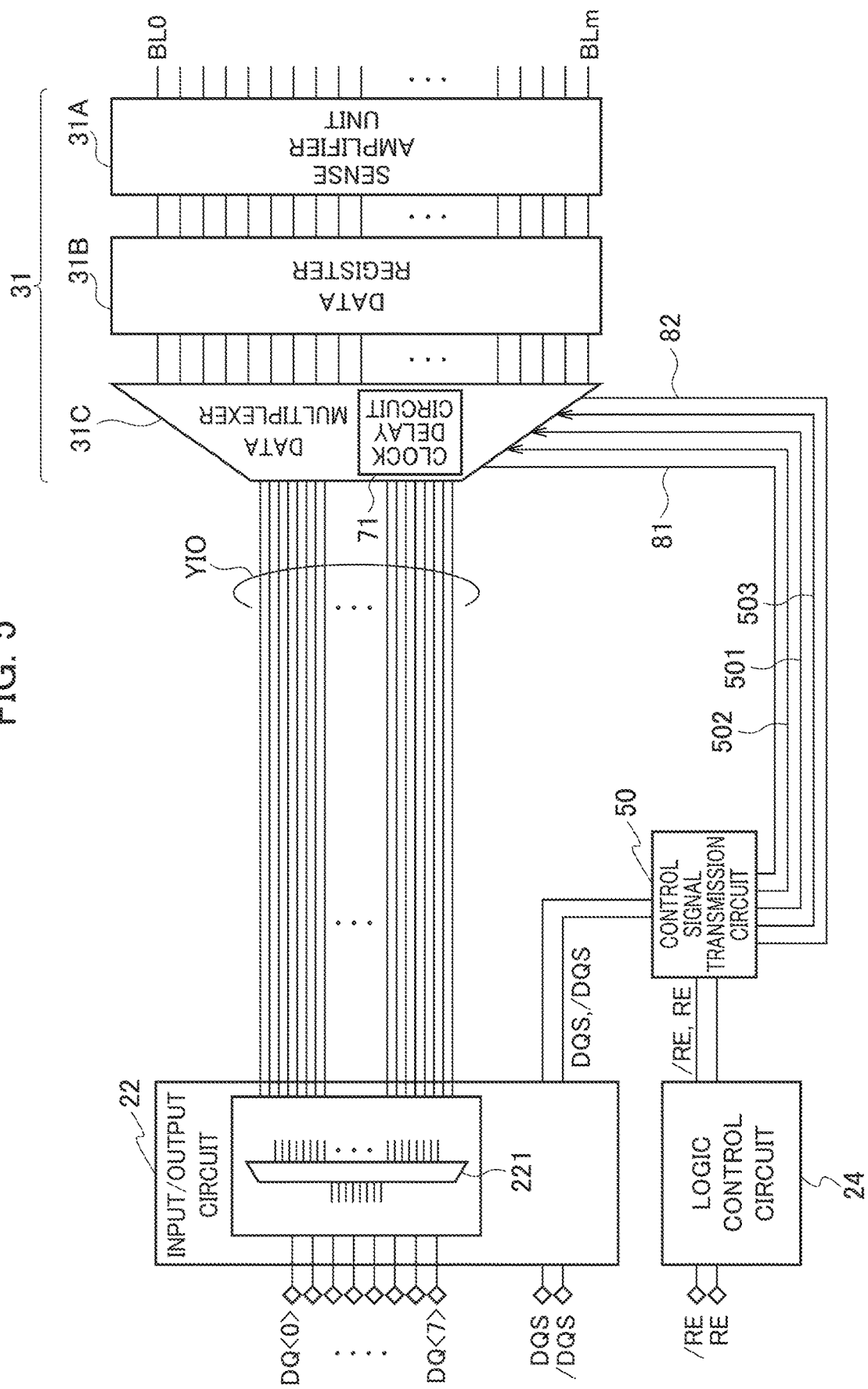
FIG. 5 is a block diagram illustrating a part of the configuration of the semiconductor storage device according to the first embodiment.

FIG. 5 is a block diagram illustrating a part of a configuration of the non-volatile memory 2. With reference to FIG. 5, description is made below on transmission/reception of data between the input/output circuit 22 and the sense amplifier 31 in the non-volatile memory 2.

The input/output circuit 22 transmits/receives the write data and the read data with the sense amplifier 31 via the data bus YIO. The data bus YIO is a configuration in which the plurality of data wiring lines for connecting the input/output circuit 22 and the sense amplifier 31 to each other are arranged adjacent to each other without shielding. For example, the data bus YIO includes 200 data wiring lines. Without shielding the data wiring lines, an increase in area of a semiconductor chip (hereinafter, simply referred to as a "chip" on which the non-volatile memory 2 is formed can be suppressed.

The sense amplifier 31 includes a sense amplifier unit 31A connected to bit lines BL0 to BLm, a data register 31B connected to the sense amplifier unit 31A, and a data multiplexer 31C connected to the data register 31B. The number of bit lines is approximately 130,000, for example. The sense amplifier unit 31A senses the read data read to the bit lines, and transfers the write data to the memory cells via the bit lines. The data register 31B stores the read data and the write data. The data multiplexer 31C selects a data signal propagating through the data wiring line constituting the data bus YIO, from the data propagating through the bit lines BL0 to BLm.

The input/output circuit 22 may include a conversion circuit 221 that converts a bus width. The conversion circuit 221 converts the data bus YIO, which includes, for example, 128 bit lines, into a bus having a bus width that includes eight data wiring lines through which the signal DQ<7:0> propagates. The conversion circuit 221 may be a first-in-first-out (FIFO) circuit, for example. An operation is performed between the sense amplifier 31 and the conversion circuit 221 at the power voltage Vcc (for example, 2.5 V). An operation is performed between the conversion circuit 221 and the memory controller 1 at the power voltage VccQ (for example, 1.2 V).

When the input/output circuit 22 and the sense amplifier 31 transmit/receive the data signals via the data bus YIO including the plurality of data wiring lines, the control signal transmission circuit 50 generates a first clock signal CLK1 having a first phase. For example, the control signal transmission circuit 50 generates the first clock signal CLK1, based on the signals IRE and RE supplied from the memory controller 1 during the data-in operation. Moreover, the control signal transmission circuit 50 generates a second clock signal CLK2 and a third clock signal CLK3 each of which has a second phase being reverse-phase to the first clock signal CLK1. The first clock signal CLK1, and the second clock signal CLK2 and the third clock signal CLK3 have opposite directions in which the signals are changed at transition timing.

As illustrated in FIG. 5, a first clock wiring line 501, a second clock wiring line 502, and a third clock wiring line 503 connect the control signal transmission circuit 50 and the data multiplexer 31C of the sense amplifier 31 to each other. The second clock wiring line 502 is arranged on one side surface of the first clock wiring line 501, and extends along the first clock wiring line 501. The third clock wiring line 503 is arranged on the other side surface of the first clock wiring line 501, and extends along the first clock wiring line 501. In the following description, when each of the first clock wiring line 501, the second clock wiring line 502, and the third clock wiring line 503 is not limited, a clock wiring line 500 is given as description. Further, the first clock signal CLK1, the second clock signal CLK2, and the third clock signal CLK3 are also collectively referred to as clock signals.

The control signal transmission circuit 50 outputs the first clock signal CLK1 to the first clock wiring line 501. Moreover, the control signal transmission circuit 50 outputs the second clock signal CLK2 to the second clock wiring line 502, and outputs the third clock signal CLK3 to the third clock wiring line 503. Note that, as illustrated in FIG. 5, a first shield line 81 may be arranged outside of the second clock wiring line 502, and a second shield line 82 may be arranged outside of the third clock wiring line 503. The first clock wiring line 501, the second clock wiring line 502, and the third clock wiring line 503 are arranged between the first shield line 81 and the second shield line 82, and thus an influence of the outside on the signal propagating through the clock wiring line 500 can be suppressed. The first shield line 81 and the second shield line 82 are set to a constant voltage, for example, a ground voltage.

The data multiplexer 31C includes a clock delay circuit 71 that delays the first clock signal CLK1 propagating through the first clock wiring line 501. The data multiplexer 31C captures the data signal transmitted from the input/output circuit 22, in response to a clock signal output from the clock delay circuit 71 (hereinafter, referred to as a "delay clock signal").

Note that the second clock wiring line 502 and the third clock wiring line 503 are arranged across the first clock wiring line 501 at positions away from the first clock wiring line 501 by a wiring line interval equivalent to a mutual interval between the data wiring lines in the data bus YIO. For example, when the interval between the data wiring lines in the data bus YIO is a first wiring line interval, an interval between the first clock wiring line 501 and the second clock wiring line 502 and an interval between the first clock wiring line 501 and the third clock wiring line 503 are the first wiring line interval.

Further, the clock wiring lines 500 is arranged so as to be an equal-length wiring line with respect to the data wiring line in the data bus YIO. For example, when the data wiring line has a first wiring line length, the clock wiring line 500 has the first wiring line length. The clock wiring line 500 and the data wiring length have the same length, and are arranged in the same wiring line layer so that the data wiring line and the clock wiring line 500 are equal-length wiring lines. The wiring line length of the clock wiring line 500 may be set to an intermediate wiring line length between the wiring line length of the longest data wiring line and the wiring line length of the shortest data wiring line. For example, when the wiring line length of the data wiring line is 6,000 µm near the center of the data bus YIO and is 6,050 µm near the outer side thereof, the wiring line length of the clock wiring line 500 is set between 6,000 µm and 6.050 µm. Further, the width of the clock wiring line 500 is set equivalent to the width of the data wiring line.

The number of data wiring lines of the data bus YIO is increased, or the frequency of the data signal is higher when the speed of the data signal is higher at an interface (IF) between the memory controller 1 and the non-volatile memory 2 that are illustrated in FIG. 1. In order to suppress an increase in chip area due to an increase in number of data wiring lines, it is advantageous to arrange the data wiring lines adjacent to each other without shielding.

Figure 6:
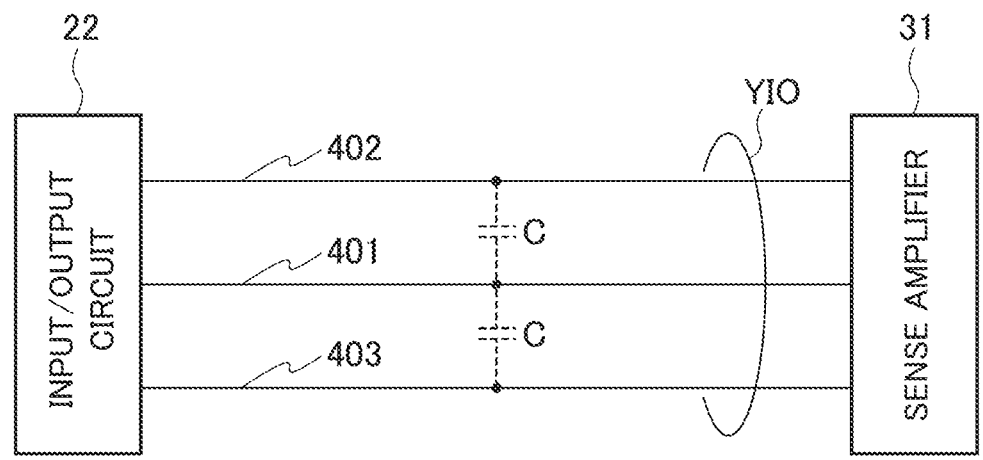
FIG. 6 is a schematic diagram illustrating an example of adjacent data wiring lines.

When the data wiring lines of the data bus YIO are arranged adjacent to each other without shielding, a propagation speed of the data signal varies between the data wiring lines that are mutually affected by capacitive coupling of the adjacent data wiring lines. In the following description, with reference to FIG. 6 illustrating a first data wiring line 401, a second data wiring line 402, and a third data wiring line 403 that are included in the data bus YIO, variation in propagation speed of the data signals is described exemplarily. The first data wiring line 401 is sandwiched between the second data wiring line 402 and the third data wiring line 403. A capacitance C indicated with the broken line in FIG. 6 indicates a capacitance value due to mutual capacitive coupling between the data wiring lines (the same holds true in the following description). In the following description, when each of the data wiring lines included in the data bus YIO is not limited, a data wiring line 400 is also given as description.

In the following description, description is made on a case in which a first data signal D1 propagates through the first data wiring line 401, a second data signal D2 propagates through the second data wiring line 402, and a third data signal D3 propagates through the third data wiring line 403. Capacitive coupling between the first data wiring line 401 and the second data wiring line 402 and capacitive coupling between the first data wiring line 401 and the third data wiring line 403 affects the propagation speed of the first data signal D1 propagating through the first data wiring line 401.

When the change of the first data signal D1 and the change of the second data signal D2 and the third data signal D3 are in the same direction, the propagation speed of the first data signal D1 on the first data wiring line 401 is higher than that in a case without an influence of capacitive coupling. In the following description, when the directions of change are the same at the same timing, such phases are described to be "in-phase".

Figure 7:
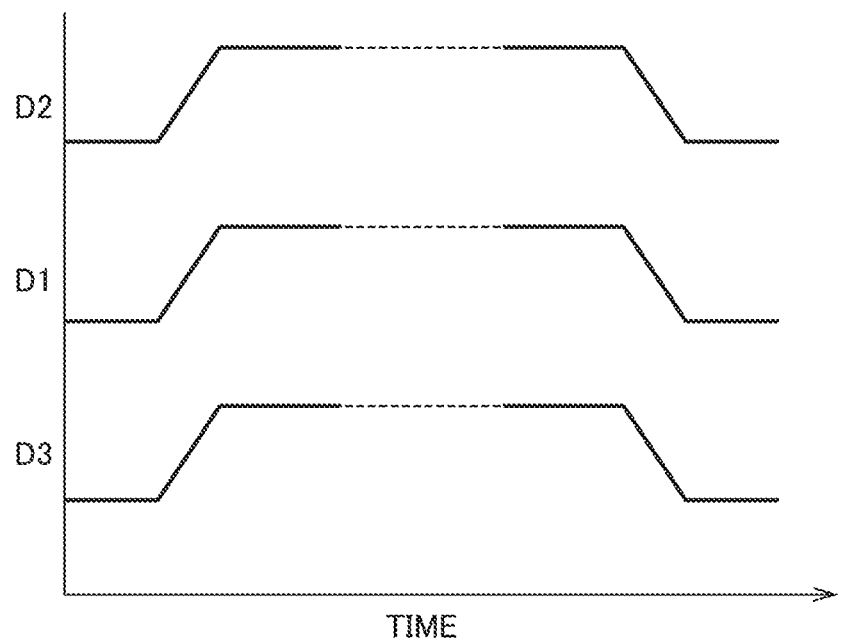
FIG. 7 is a timing chart illustrating an example of changes in data signals on the data wiring lines illustrated in FIG. 6.

As illustrated in FIG. 7, when the first data signal D1, the second data signal D2, and the third data signal D3 are changed from low (L) to high (H) or from high (H) to low (L) at the same time, the propagation speed of the first data signal D1 on the first data wiring line 401 is higher. When a signal on a freely-selected data wiring line 400 and signals on data wiring lines 400 (hereinafter, referred to as "adjacent data wiring lines") on both sides of the data wiring line 400 are in-phase, the propagation speed of the data signal on the data wiring line 400 sandwiched between the adjacent data wiring lines is increased most.

Meanwhile, when the change of the first data signal D1 and the change of the second data signal D2 and the third data signal D3 are in the directions opposite to each other, the propagation speed of the first data signal on the first data wiring line 401 is lower than that in a case without an influence of capacitive coupling. In the following description, when the directions of change are opposite at the same timing, such phases are described to be "reverse-phase".

Figure 8:
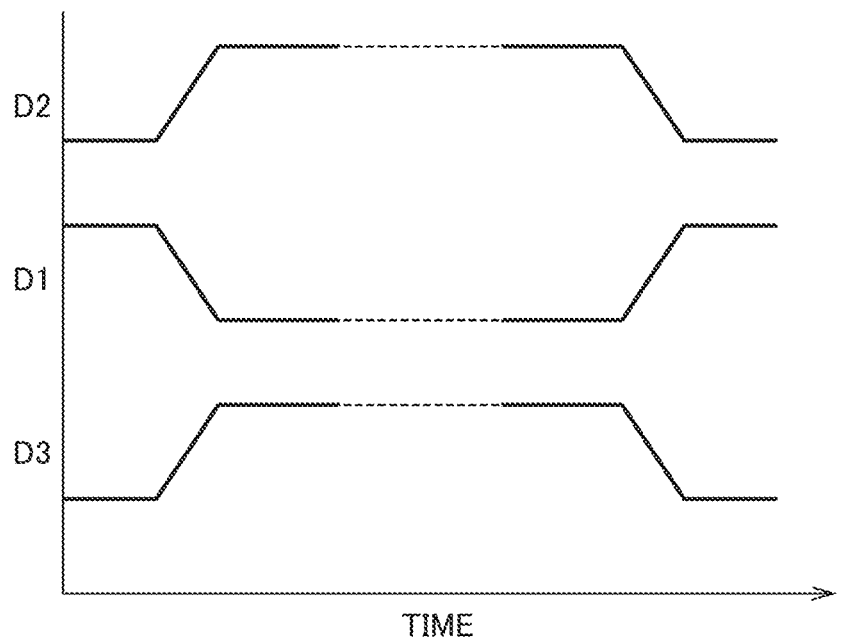
FIG. 8 is a timing chart illustrating another example of changes in data signals on the data wiring lines illustrated in FIG. 6.

As illustrated in FIG. 8, when the second data signal D2 and the third data signal D3 are changed from low (L) to high (H) at timing when the first data signal D1 is changed from high (H) to low (L), the propagation speed of the first data signal D1 on the first data wiring line 401 reduced. Further, when the second data signal D2 and the third data signal D3 are changed from high (H) to low (L) at timing when the first data signal D1 is changed from low (L) to high (H), the propagation speed of the first data signal D1 on the first data wiring line 401 reduced. When a signal on a freely-selected data wiring line 400 and signals on the data wiring lines adjacent to the data wiring line 400 are reverse-phase, the propagation speed of the data signal on the data wiring line 400 sandwiched between the adjacent data wiring lines is reduced most.

Figure 9:
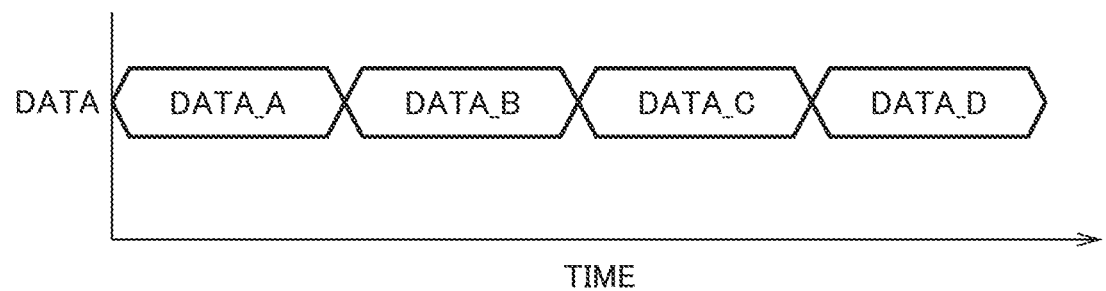
FIG. 9 is a timing chart illustrating an example of data signals at a transmission-side circuit.

Due to variation in propagation speed of the data signals, which is caused in the data bus YIO as described above, variation is caused between the data wiring lines 400 at timing when the sense amplifier 31 receives the head and the tail of the data signal. For example, as illustrated in FIG. 9, in the input/output circuit 22 that transmits the data signals, variation at heads and tails of data signals DATA including data DATA_A, DATA_B, . . . , does not occur between the data wiring lines. The data signals DATA illustrated in FIG. 9 are signals expressed by overlapping a time axis with the data signals propagating through the plurality of data wiring lines 400 (the same holds true in the following description). However, in the sense amplifier 31 that receives the data signals, variation at the heads and the tails of the data signals occurs between the data wiring lines.

Figure 10:
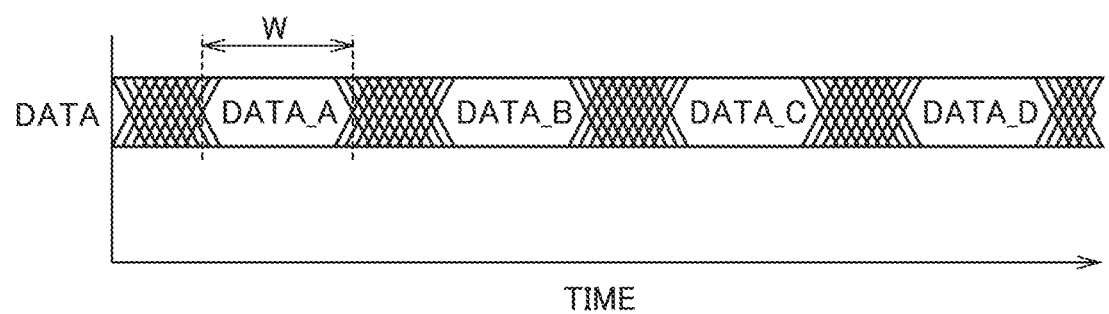
FIG. 10 is a timing chart illustrating an example of data signals at a reception-side circuit.

As a result of variation at the heads and the tails of the data signals, as illustrated in FIG. 10, a width W of a valid window the data signals DATA received by the sense amplifier 31 is narrow. As the propagation frequency of the data signal is higher, the width W of the valid window is further narrower. As the width W of the valid window is narrower, it is more difficult to adjust timing of an operation of receiving the data signals by the sense amplifier 31 in response to the clock signal. In other words, in the sense amplifier 31, it is challenging to adjust the clock signal so as to secure a setup time and a hold time for capturing the data signals accurately. Moreover, when an interval between the input/output circuit 22 and the sense amplifier 31 is increased, it is required to consider variation in voltage gradients within a chip and characteristics of elements such as a transistor, and hence it is more difficult to adjust the timing of the reception operation in response to the clock signal.

Figure 11:
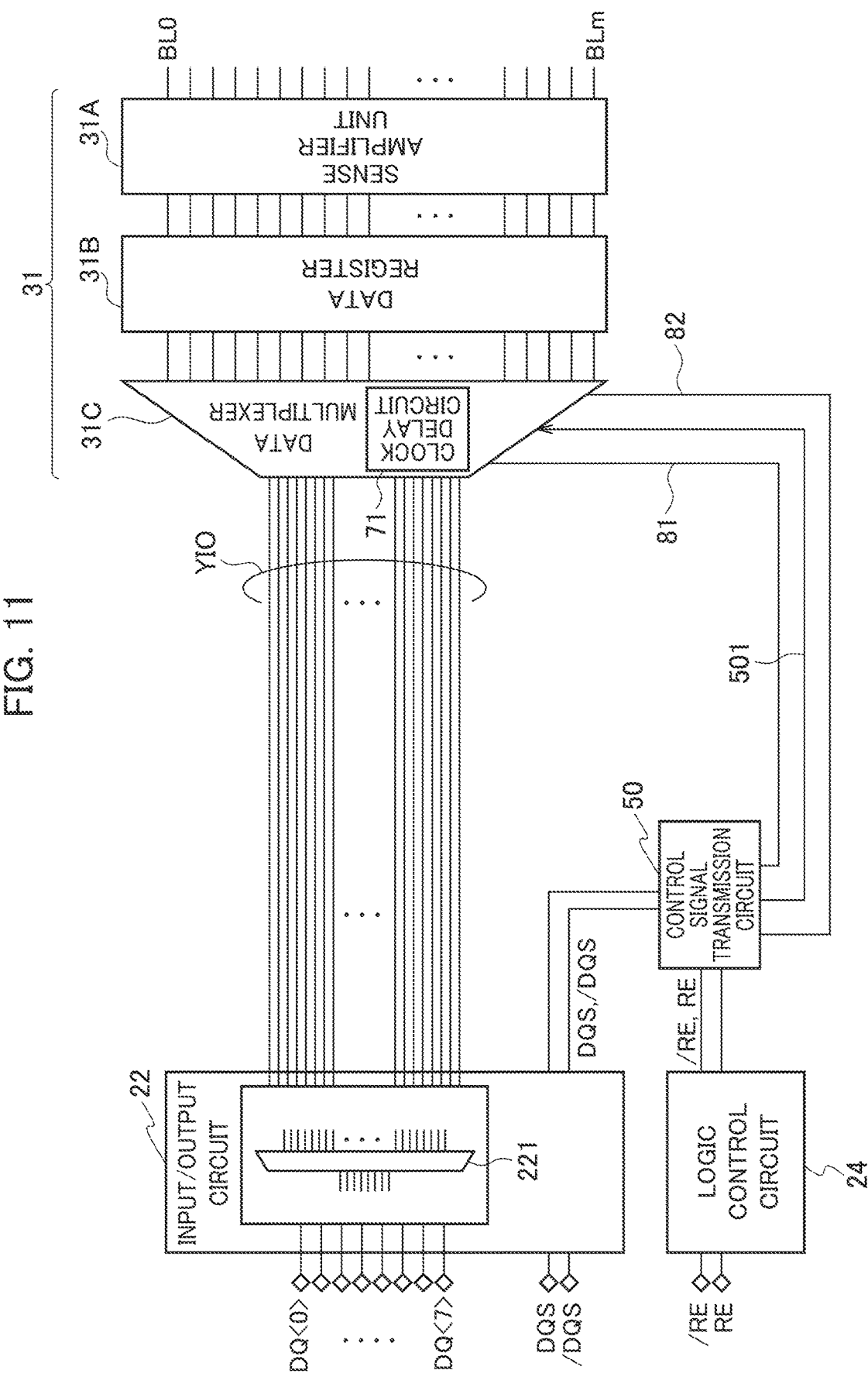
FIG. 11 is a block diagram illustrating a configuration of a semiconductor storage device in a comparative example.

Herein, description is made on transmission/reception of a data signal of a non-volatile memory in a comparative example illustrated in FIG. 11. FIG. 11 is a block diagram illustrating a part of a configuration of the non-volatile memory in the comparative example. As illustrated in in FIG. 11, the non-volatile memory in the comparative example includes the input/output circuit 22, the sense amplifier 31, the control signal transmission circuit 50, the data bus YIO, and the first clock wiring line 501. In the non-volatile memory in the comparative example, only the first clock wiring line 501 connects the control signal transmission circuit 50 and the sense amplifier 31 to each other. The clock signal for controlling a reception operation of a data signal at the sense amplifier 31 propagates through the first clock wiring line 501.

The sense amplifier 31 of the non-volatile memory in the comparative example illustrated in FIG. 11 includes the clock delay circuit 71 that delays the clock signal propagating through the first clock wiring line 501 so as to secure a setup time and a hold time during the reception operation of the sense amplifier 31. However, in the non-volatile memory in the comparative example, it is difficult to adjust the timing of the clock signal during the reception operation of the sense amplifier 31. A state of the difference between the propagation speeds of the data signals varies depending on a combination of the changes of the data signals propagating respectively through the plurality of data wiring lines 400. Thus, in order to delay the clock signal in conformity with the position of the valid window, it is required that the clock delay circuit 71 have a large delay adjustment range. It is required to increase the area of the clock delay circuit 71 so that the clock delay circuit 71 has a sufficient delay adjustment range. Alternatively, when a sufficient delay adjustment range is to be provided while suppressing the area of the clock delay circuit 71, adjustment accuracy may be degraded, and a setup time and a hold time during the reception operation of the sense amplifier 31 may not be secured in some cases.

There may be conceived countermeasures for increasing the interval between the data wiring lines 400 or shielding the data wiring lines 400, in order to suppress an influence of capacitive coupling between the data wiring lines. However, with those countermeasures, the chip area is disadvantageously increased.

In contrast, according to the semiconductor storage device illustrated in FIG. 5, as described below, the data signals propagating through the plurality of data wiring lines 400 adjacent to each other in parallel can be captured accurately.

In the semiconductor storage device illustrated in FIG. 5, when the data signal is transmitted from the input/output circuit 22 to the sense amplifier 31 via the data bus YIO, the control signal transmission circuit 50 outputs the first clock signal CLK1 having the first phase to the first clock wiring line 501. In this state, the control signal transmission circuit 50 outputs the first clock signal CLK1 to the first clock wiring line 501 while matching the transition timing of the first clock signal CLK1 and the head of the data signal with each other. In other words, during the data-in operation, while matching the transition timing of the first clock signal CLK1 and the head of the data signal with each other, the control signal transmission circuit 50 transmits the first clock signal CLK1 to the sense amplifier 31 being a reception-side circuit that receives the data signals.

Further, the control signal transmission circuit 50 outputs the second clock signal CLK2 to the second clock wiring line 502 and outputs the third clock signal CLK3 to the third clock wiring line 503, at timing in conformity with the output of the first clock signal CLK1. In other words, the first clock signal CLK1, the second clock signal CLK2, and the third clock signal CLK3 have the matching transition timing.

Figure 12:
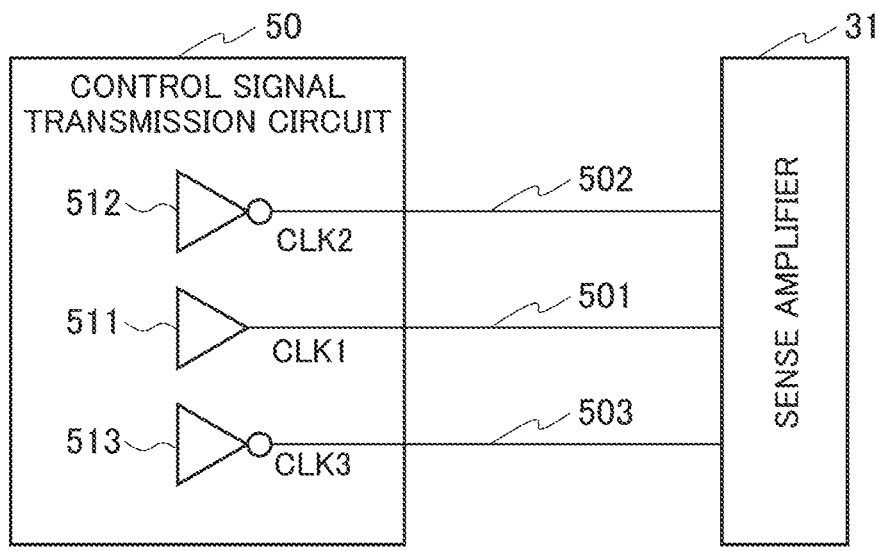
FIG. 12 is a block diagram illustrating a configuration of a control signal transmission circuit of the semiconductor storage device according to the first embodiment.

As illustrated in FIG. 12, the control signal transmission circuit 50 includes a first clock driver 511 that outputs the first clock signal CLK1, a second clock driver 512 that outputs the second clock signal CLK2, and a third clock driver 513 that outputs the third clock signal CLK3. In the following description, when each of the first clock driver 511, the second clock driver 512, and the third clock driver 513 is not limited, a clock driver 510 is given as description. Driving forces for outputting signals from the first clock driver 511, the second clock driver 512, and the third clock driver 513 are equivalent to one another. Moreover, a driving force of the clock driver 510 is equivalent to a driving force of a data driver (omitted in illustration) that outputs the data signal to the data bus YIO.

Figure 13:
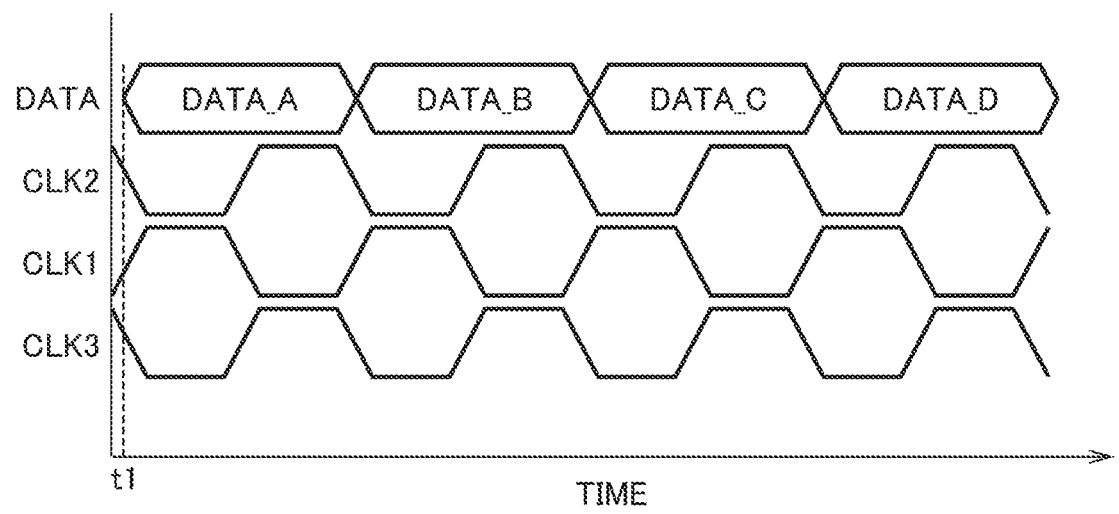
FIG. 13 is a timing chart illustrating an example of a data signal and clock signals at the transmission-side circuit of the semiconductor storage device according to the first embodiment.

FIG. 13 illustrates a timing chart of the data signal DATA that is output from the input/output circuit 22, and the first clock signal CLK1, the second clock signal CLK2, and the third clock signal CLK3 that are output from the control signal transmission circuit 50, in the semiconductor storage device according to the first embodiment. At a time point t1, the transition timing of the first clock signal CLK1 and the head of the data signal DATA match with each other.

As illustrated in FIG. 13, the first clock signal CLK1, and the second clock signal CLK2 and the third clock signal CLK3 are reverse-phase. Thus, the propagation speed of the first clock signal CLK1 propagating through the first clock wiring line 501 is affected by capacitive coupling the second clock wiring line 502 and the third clock wiring line 503, and the first clock wiring line 501, and is reduced. Among various combinations of the phases of the signals propagating through the clock wiring line 500, when the phase of the first clock signal CLK1 is reverse-phase with respect to the phases of the second clock signal CLK2 and the third clock signal CLK3, the propagation speed of the first clock signal CLK1 is reduced most.

The clock wiring line 500 and the data wiring line 400 of the data bus YIO are equal-length wiring lines. Further, the width and the mutual interval of the clock wiring line 500 are equivalent to the width and the mutual interval of the data wiring line 400, and hence capacitive coupling between the data wiring lines 400 and capacitive coupling between the clock wiring lines are equivalent to each other in magnitude. Further, a driving force for outputting the clock signal from the clock driver 510 to the clock wiring line 500 is equivalent to a driving force for outputting the data signal from the data driver to the data wiring line 400. Further, the phase of the first clock signal CLK1, and the phases of the second clock signal CLK2 and the third clock signal CLK3 are reverse-phase. Thus, the propagation speed of the first clock signal CLK1 propagating through the first clock wiring line 501 is equivalent to the lowest propagation speed of the data signal of the data wiring line 400, which is described with reference to FIG. 8. In other words, as illustrated in FIG. 14, at a time point ts, at the sense amplifier 31 that receives the data signal, the transition timing of the first clock signal CLK1 and the head of the data signal DATA of the data wiring line 400, which has the lowest propagation speed of the data signal, match with each other.

The sense amplifier 31 captures the data signal in response to a delay clock signal CLKd that is output from the clock delay circuit 71 receiving the first clock signal CLK1. Specifically, the sense amplifier 31 captures the data signal at a rising edge of the first clock signal CLK1. Due to the clock delay circuit 71, the transition timing of the delay clock signal CLKd moves along the time axis relatively with respect to the valid window of the data signal at the sense amplifier 31.

Figure 14:
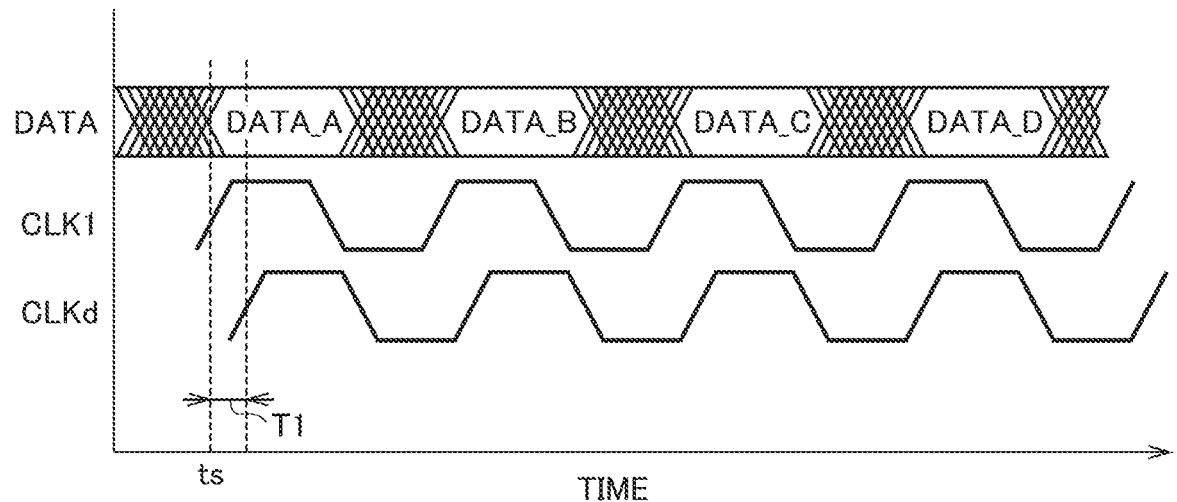
FIG. 14 is a timing chart illustrating a data signal and clock signals at the reception-side circuit of the semiconductor storage device according to the first embodiment.

Therefore, a clock delay time T1 due to the clock delay circuit 71 illustrated in FIG. 14 is set to a time corresponding to the setup time of the sense amplifier 31, and thus a setup time can be secured for the data wiring line 400 with the lowest propagation speed. As a result, the sense amplifier 31 can accurately capture the data signals of all the data wiring lines 400. The clock delay time T1 is set in conformity with the specification of the setup time of the sense amplifier 31 that is required for capturing the data signal. In other words, even when variation in propagation speed of the data signals on the data wiring lines 400 is undetermined at the time of designing the semiconductor storage device, the signal propagation speed in the worst case can be obtained, and the clock delay time T1 corresponding to the setup time of the sense amplifier 31 can be set with the signal propagation speed as a reference.

As described above, at the reception-side circuit of the semiconductor storage device according to the first embodiment, the transition timing of the clock signal and the head of the data signal having the lowest propagation speed match with each other, and the clock signal is delay by a time corresponding to the setup time. Thus, even when variation is caused between the heads and the tails of the data signals at the reception-side circuit that receives the plurality of data signals, the transition timing of the clock signal for controlling the operation of receiving the data signals can be adjusted appropriately with respect to the valid window without increasing the delay adjustment range of the clock delay circuit 71 (without increasing the area of the clock delay circuit 71). Therefore, according to the semiconductor storage device according to the first embodiment, even when the width W of the valid window of the data signals received from the plurality of data wiring lines 400 is narrow, the data signal can be captured accurately at the reception-side circuit.

Figure 15A:
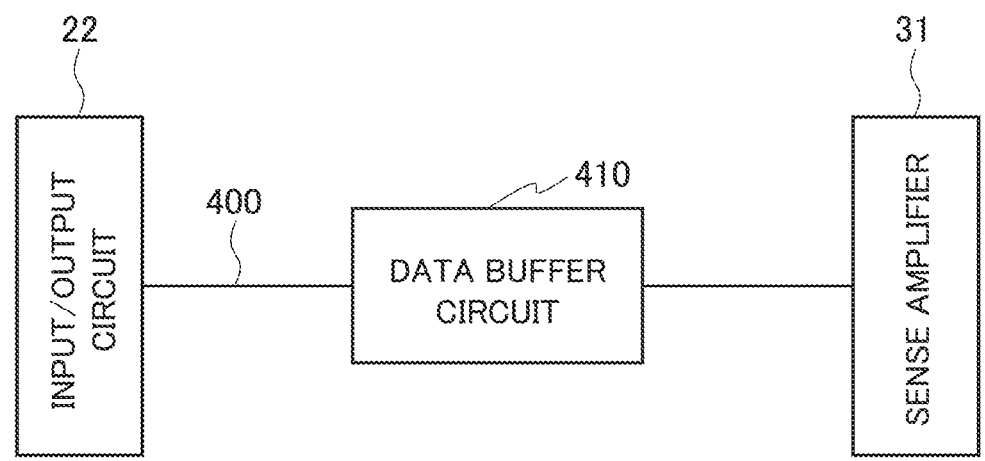
FIG. 15A is a schematic circuit diagram illustrating an arrangement example of a data buffer circuit.
Figure 15B:
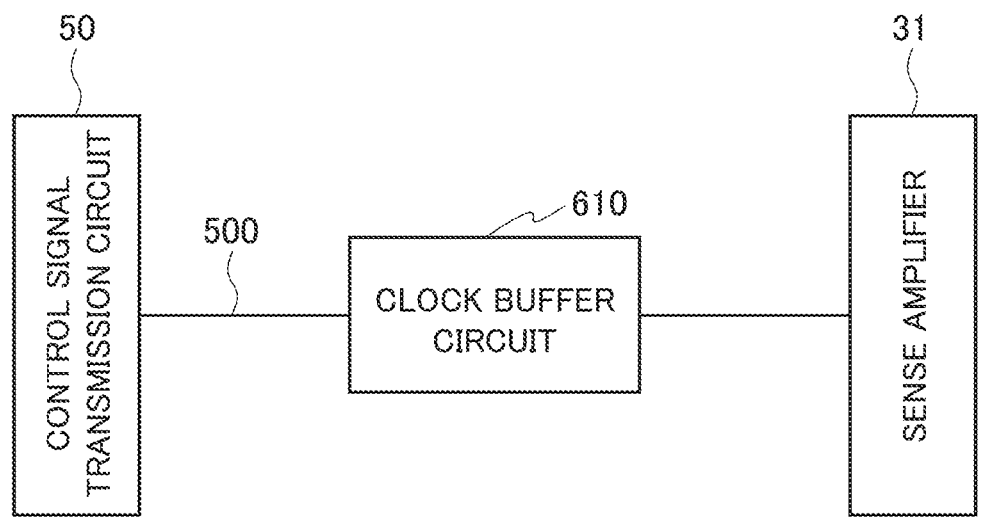
FIG. 15B is a schematic circuit diagram illustrating an arrangement example of a clock buffer circuit.

Incidentally, when a data buffer circuit 410 for driving the data signal, which is illustrated in FIG. 15A, is arranged in the middle of the data wiring line 400, it is preferred that a clock buffer circuit 610 for driving the clock signal, which is illustrated in FIG. 15B, be arranged in the middle of the clock wiring line 500. In this state, it is preferred that the wiring line length of the data wiring line 400 from the input/output circuit 22 to the data buffer circuit 410 and the wiring line length of the clock wiring line 500 from the control signal transmission circuit 50 to the clock buffer circuit 610 be equivalent to each other. Further, driving forces of the data buffer circuit 410 and the clock buffer circuit 610 are equivalent to each other. With this, the clock wiring line 500 and the data wiring line 400 can be maintained as equal-length wiring lines, and the transition timing of the clock signal and the head of the data signal having the lowest propagation speed can match with each other at the reception-side circuit.

Figure 16:
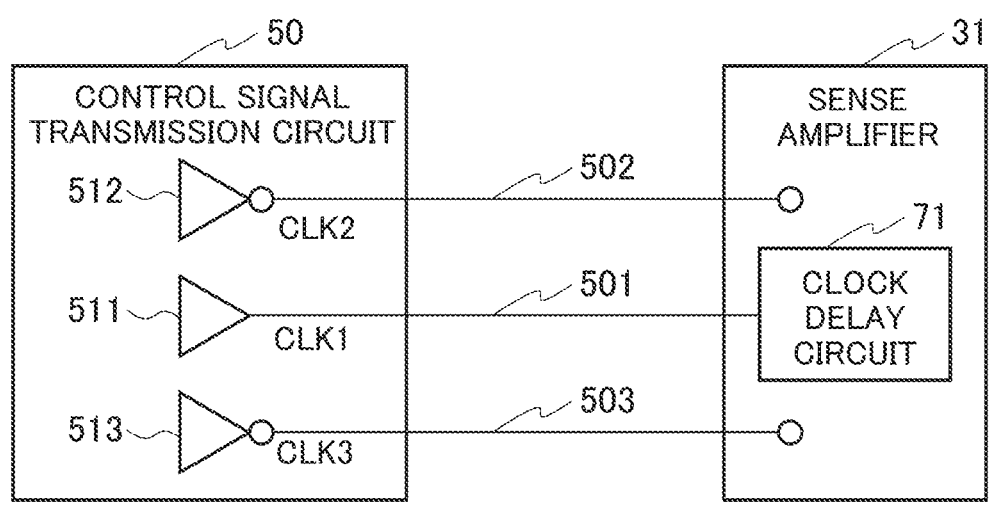
FIG. 16 is a schematic circuit diagram illustrating an example of a connection state of ends of clock wiring lines of the semiconductor storage device according to the first embodiment.

The ends of the second clock wiring line 502 and the third clock wiring line 503 that extend to the sense amplifier 31 are terminated appropriately so as to stabilize the phases and the amplifications of the second clock signal CLK2 and the third clock signal CLK3. For example, as illustrated in FIG. 16, the ends of the second clock wiring line 502 and the third clock wiring line 503 may be open ends. Alternatively, the second clock signal CLK2 or the third clock signal CLK3 that propagates to the sense amplifier 31 may be reused for the operation of the non-volatile memory 2.

Second Embodiment

Figure 17:
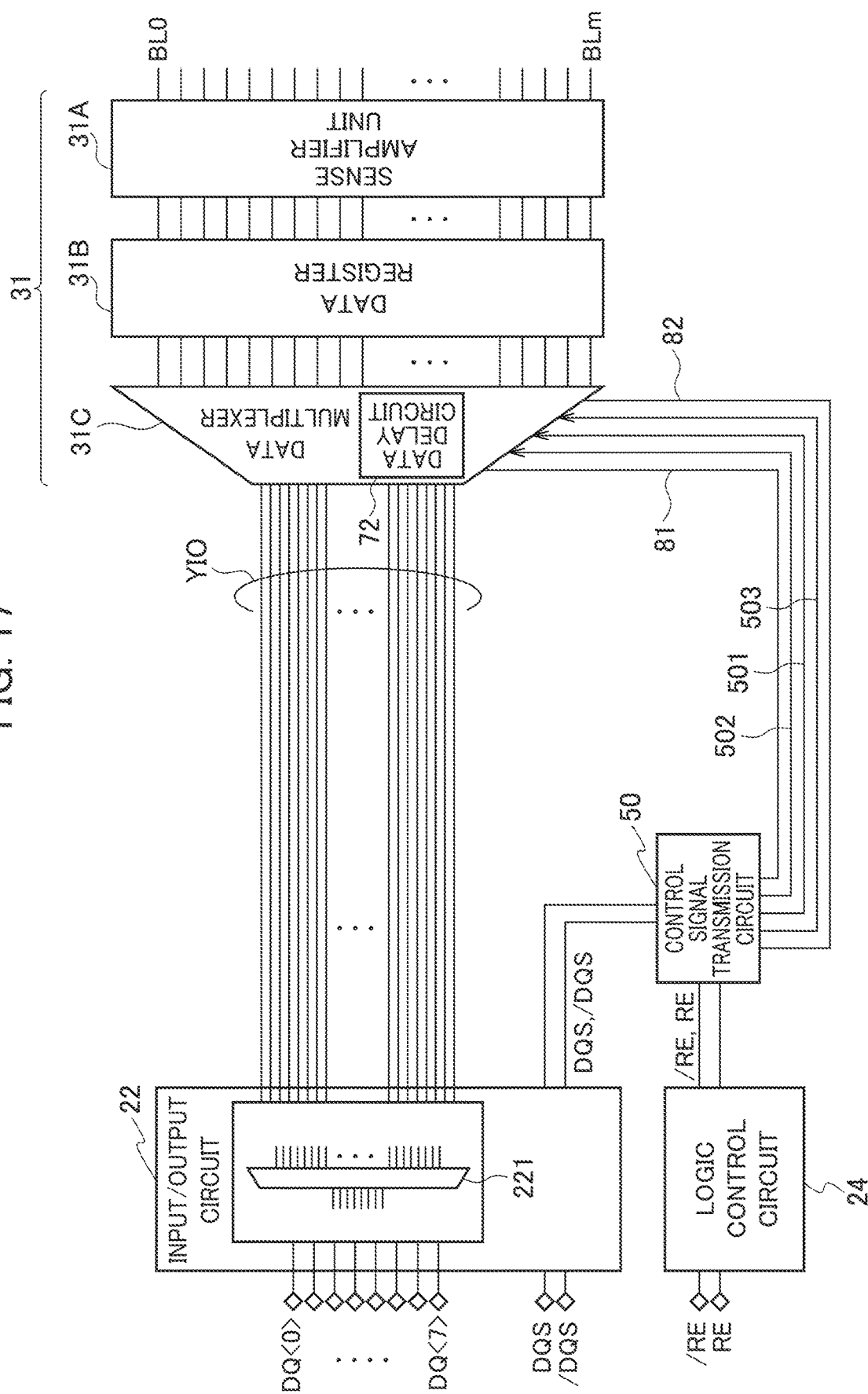
FIG. 17 is a block diagram illustrating a configuration of a semiconductor device according to a second embodiment.

As illustrated in FIG. 17, a semiconductor storage device according to a second embodiment of the present invention includes a data relay circuit 72 in which the data multiplexer 31C delays the data signal transmitted from the input/output circuit 22. The semiconductor storage device illustrated in FIG. 17 is has different from the semiconductor storage device according to the first embodiment in that, in its configuration, the sense amplifier 31 includes the data delay circuit 72 in place of the clock delay circuit 71. Further, the control signal transmission circuit 50 of the semiconductor storage device according to the second embodiment generates the first clock signal CLK1, the second clock signal CLK2, and the third clock signal CLK3 each of which has the first phase, which is described below in detail. Further, during the data-in operation, the control signal transmission circuit 50 outputs the first clock signal CLK1 to the first clock wiring line 501 while matching the transition timing of the first clock signal CLK1 and the tail of the data signal with each other. With regard to the other matters, the semiconductor storage device according to the second embodiment is substantially the same as the first embodiment, and overlapping description thereof is omitted. For example, the data wiring line 400 and the clock wiring line 500 are equal-length wiring lines, and the width and the mutual interval of the data wiring line 400 and the width and the mutual interval of the width of the clock wiring line 500 are equivalent to each other. A driving force for outputting the signal to the data wiring line 400 and a driving force for outputting the signal to the clock wiring line 500 are equivalent to each other.

When the data signals are transmitted from the input/output circuit 22 to the sense amplifier 31 via the plurality of data wiring lines 400 of the data bus YIO, the control signal transmission circuit 50 illustrated in FIG. 17 outputs the first clock signal CLK1 having the first phase to the first clock wiring line 501. In this state, the control signal transmission circuit 50 outputs the first clock signal CLK1 while matching the transition timing of the first clock signal CLK1 and the tail of the data signal with each other. In other words, during the data-in operation, the control signal transmission circuit 50 outputs the first clock signal CLK1 to the sense amplifier 31 being a reception-side circuit that receives the data signals, while matching the transition timing of the first clock signal CLK1 and the tail of the data signal with each other.

Figure 18:
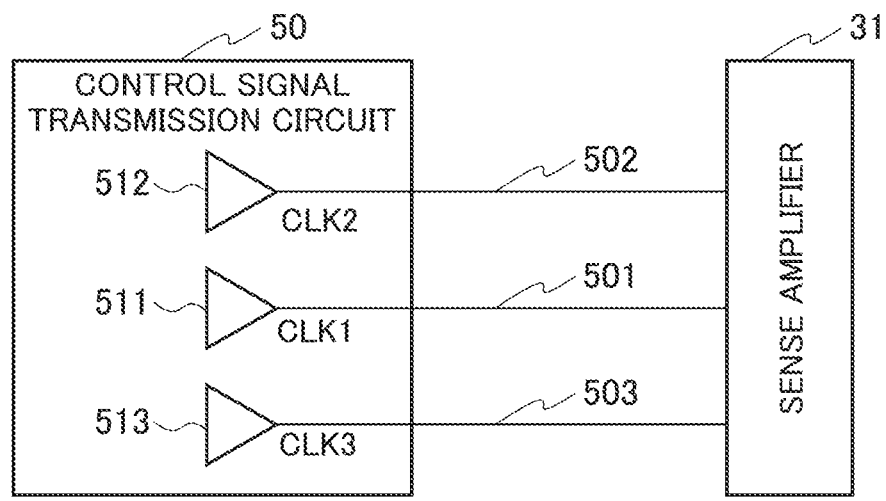
FIG. 18 is a block diagram illustrating a configuration of a control signal transmission circuit of the semiconductor storage device according to the second embodiment.

The control signal transmission circuit 50 outputs the second clock signal CLK2 having the first phase to the second clock wiring line 502 and outputs the third clock signal CLK3 having the first phase to the third clock wiring line 503, at timing in conformity with the output of the first clock signal CLK1 having the first phase. In other words, the first clock signal CLK1, the second clock signal CLK2, and the third clock signal CLK3 have the matching transition timing. For example, the control signal transmission circuit 50 illustrated in FIG. 18 includes the first clock driver 511 that outputs the first clock signal CLK1, the second clock driver 512 that outputs the second clock signal CLK2, and the third clock driver 513 that outputs the third clock signal CLK3. The first clock driver 511, the second clock driver 512, and the third clock driver 513 output the clock signals that are in-phase, with the equivalent driving forces.

Figure 19:
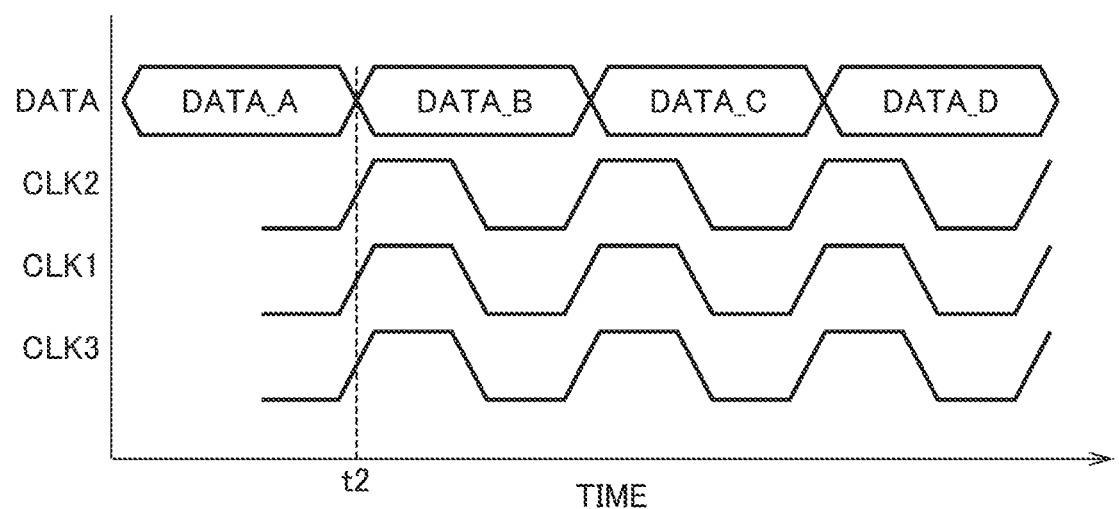
FIG. 19 is a timing chart illustrating an example of a data signal and clock signals at a transmission-side circuit of the semiconductor storage device according to the second embodiment.

FIG. 19 illustrates a timing chart of the data signal DATA that is output from the input/output circuit 22 and the first clock signal CLK1, the second clock signal CLK2, and the third clock signal CLK3 that are output from the control signal transmission circuit 50 in the semiconductor storage device according to the second embodiment. At a time point t2, the transition timing of the first clock signal CLK1 and the tail of the data signal DATA match with each other.

As illustrated in FIG. 19, the first clock signal CLK1, and the second clock signal CLK2 and the third clock signal CLK3 are in-phase. Thus, the propagation speed of the first clock signal CLK1 propagating through the first clock wiring line 501 is affected by capacitive coupling between the first clock wiring line 501, and the second clock wiring line 502 and the third clock wiring line 503, and is increased. Among various combinations of the phases of the signals propagating through the clock wiring line 500, when the first clock signal CLK1, the second clock signal CLK2, and the third clock signal CLK3 are in-phase, the propagation speed of the first clock signal CLK1 is increased most.

Therefore, the propagation speed of the first clock signal CLK1 propagating through the first clock wiring line 501 is equivalent to the highest propagation speed of the data signal of the data wiring line 400, which is described with reference to FIG. 7. In other words, as illustrated in FIG. 20, at the sense amplifier 31 that receives the data signal, at a time point th, the transition timing of the first clock signal CLK1 and the tail of the data signal of the data wiring line 400, which has the highest propagation speed of the signal, match with each other.

The sense amplifier 31 captures a delay data signal DATAd that is output from the data delay circuit 72, in response to the first clock signal CLK1. The data delay circuit 72 delays all the data signals propagating respectively through the plurality of data wiring lines 400 included in the data bus YIO. Thus, the valid window of the data signal at the sense amplifier 31 moves along the time axis relatively with respect to the transition timing of the first clock signal CLK1, without changing the width W.

Figure 20:
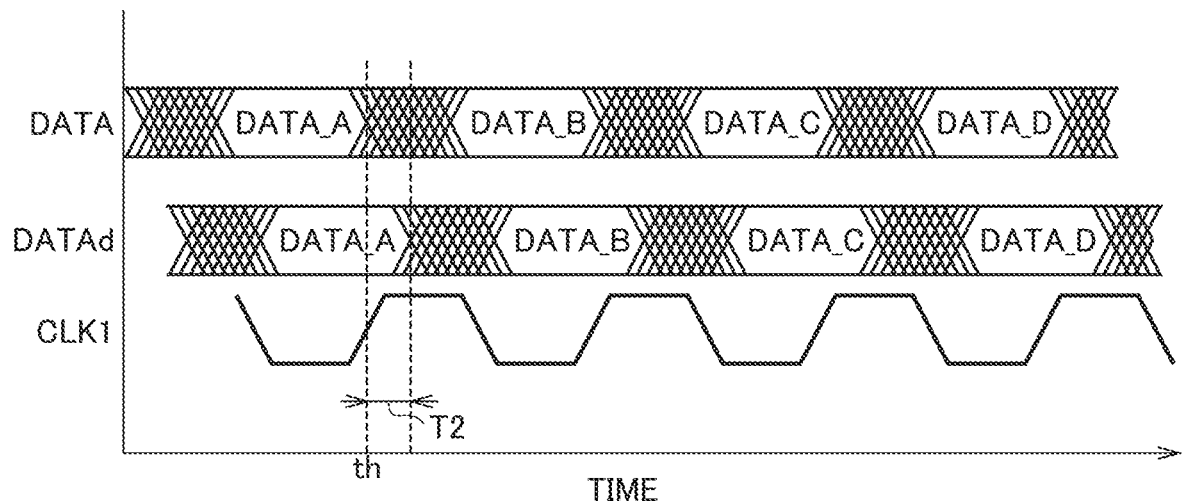
FIG. 20 is a timing chart illustrating a data signal and clock signals at a reception-side circuit of the semiconductor storage device according to the second embodiment.

Therefore, as illustrated in FIG. 20, a data delay time T2 due to the data delay circuit 72 is set to a time corresponding to the hold time of the sense amplifier 31, and thus a hold time can be secured for the data wiring line 400 having the highest propagation speed. As a result, the sense amplifier 31 can accurately capture the data signals of all the data wiring lines 400. The data delay time T2 is set in conformity with the specification of the hold time of the sense amplifier 31 that is required for capturing the data signal. In other words, even when variation in propagation speed of the data signals on the data wiring lines 400 is undetermined at the time of designing the semiconductor storage device, the data delay time T2 can be set according to the hold time of the sense amplifier 31.

As described above, at the reception-side circuit of the semiconductor storage device according to the second embodiment, the transition timing of the clock signal and the tail of the data signal having the highest propagation speed match with each other, and the data signal is delayed by a time corresponding to the hold time. Thus, even when variation is caused between the heads and the tails of the data signals at the reception-side circuit that receives the plurality of data signals, the transition timing of the clock signal for controlling the operation of receiving the data signals can be adjusted appropriately with respect to the valid window. Therefore, according to the semiconductor storage device according to the second embodiment, when the width of the valid window of the data signals received from the plurality of data wiring lines 400 is narrow, the data signal can be captured accurately at the reception-side circuit. With regard to the other matters, the second embodiment is substantially the same as the first embodiment, and overlapping description thereof is omitted.

Third Embodiment

Figure 21:
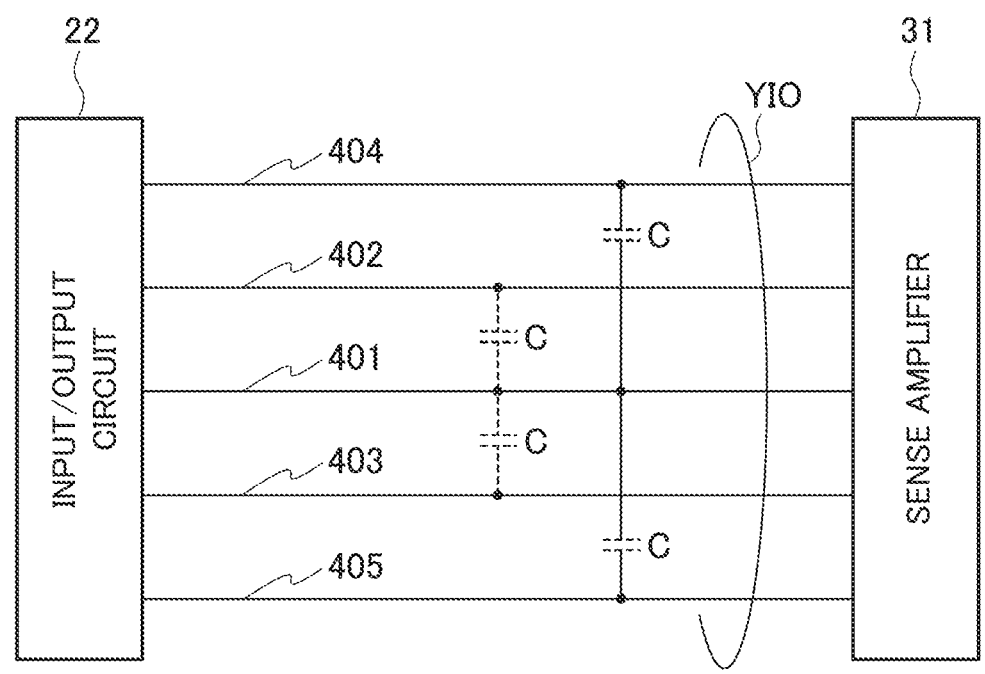
FIG. 21 is a schematic diagram illustrating an example of external data wiring lines.

In the first embodiment described above, the change of the propagation speed of the data signal due to an influence of capacitive coupling with the adjacent data wiring lines is taken into account. However, it is considered that capacitive coupling between the data wiring lines 400 on the further outer side of the adjacent data wiring lines (hereinafter, also referred to as "outer data wiring lines") may affect the propagation speed of the data signal on the data wiring line 400. As examples of the outer data wiring lines. FIG. 21 illustrates a fourth data wiring line 404 that is arranged on the outer side of the second data wiring line 402 being an adjacent data wiring line and a fifth data wiring line 405 that is arranged on the outer side of the third data wiring line 403 being an adjacent data wiring line. In the following description, a data signal propagating through the fourth data wiring line 404 is a fourth data signal D4, and a data signal propagating through the fifth data wiring line 405 is a fifth data signal D5.

Figure 22:
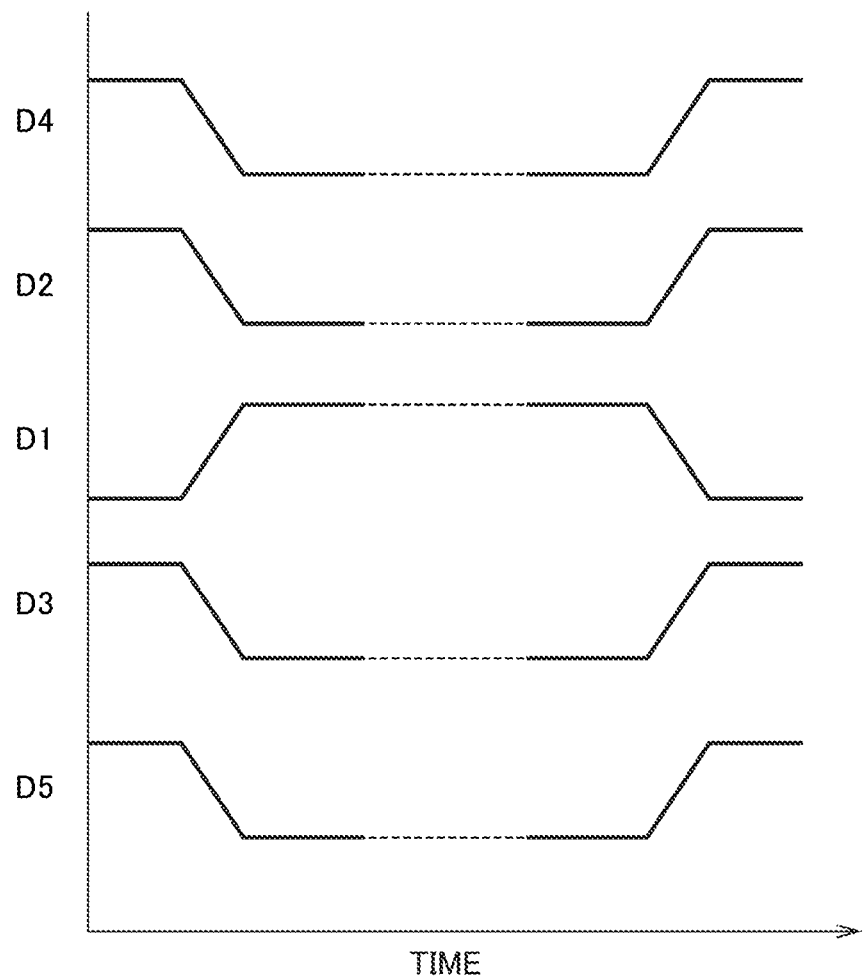
FIG. 22 is a timing chart illustrating an example of changes in data signals on the data wiring lines illustrated in FIG. 21.

As illustrated in FIG. 22, the first data signal D1 propagating through the data wiring line 400, and the second data signal D2 and the third data signal D3 that propagate through the adjacent data wiring lines and the fourth data signal D4 and the fifth data signal D5 that propagate through the outer data wiring lines are reverse-phase in some cases. In the state illustrated in FIG. 22, the propagation speed of the first data signal D1 is further reduced more than a case in which only an influence of capacitive coupling with the adjacent data wiring lines is present.

As described below, a semiconductor storage device according to a third embodiment includes the clock driver 410 in which driving forces are set in consideration with an influence of capacitive coupling with the outer data wiring lines, in addition to an influence of capacitive coupling with the adjacent data wiring lines.

Figure 23:
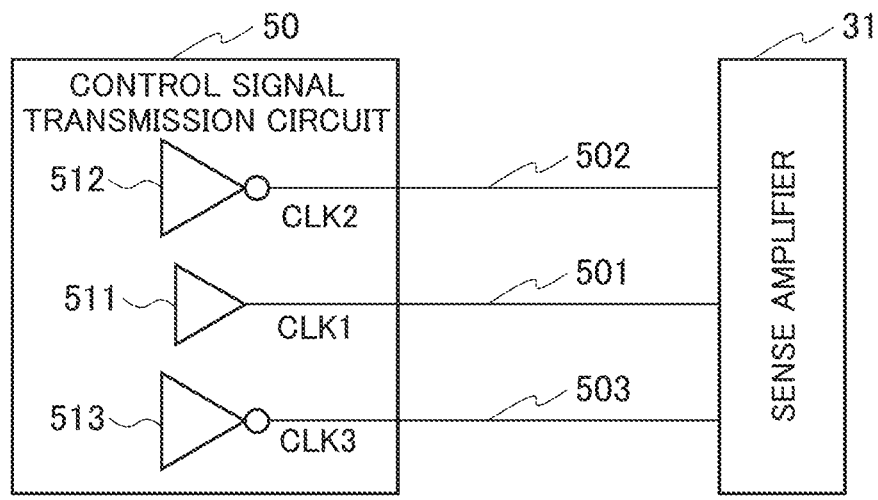
FIG. 23 is a block diagram illustrating a configuration of a control signal transmission circuit of a semiconductor storage device according to a third embodiment.

In the control signal transmission circuit 50 of the semiconductor storage device according to the third embodiment, which is illustrated in FIG. 23, driving force of the second clock driver 512 and the third clock driver 513 (hereinafter, referred to as a "second driving force") is larger than a driving force of the first clock driver 511 (hereinafter, referred to as a "first driving force"). With regard to the other configurations, the semiconductor storage device according to the third embodiment is similar to the first embodiment illustrated in FIG. 5. For example, the data multiplexer 31C includes the clock delay circuit 71 that delays the first clock signal CLK1 propagating through the first clock wiring line 501.

For example, the size of the output transistor that outputs the clock signals of the second clock driver 512 and the third clock driver 513 is larger than the size of the output transistor of the first clock driver 511. With this, a driving electric current flowing through the output transistor of the second clock driver 512 and the third clock driver 513 is larger than a driving electric current flowing through the output transistor of the first clock driver 511.

When the driving force of the second clock driver 512 and the third clock driver 513 is increased, rising edge and falling edges of the second clock signal CLK2 and the third clock signal CLK3 are steep. As a result, the propagation speed of the first clock signal CLK1 propagating through the first clock wiring line 501 is changed significantly.

The difference between the first driving force and the second driving force is set in consideration with a difference between an influence of capacitive coupling with the adjacent data wiring lines and an influence of capacitive coupling with both the adjacent wiring lines and the outer data wiring lines. In other words, the second driving force is set so that the change of the propagation speed of the first clock signal CLK1 due to the difference between the first driving force and the second driving force is equivalent to the change of the propagation speed of the data signal due to further addition of capacitive coupling with the outer data wiring lines.

Figure 24:
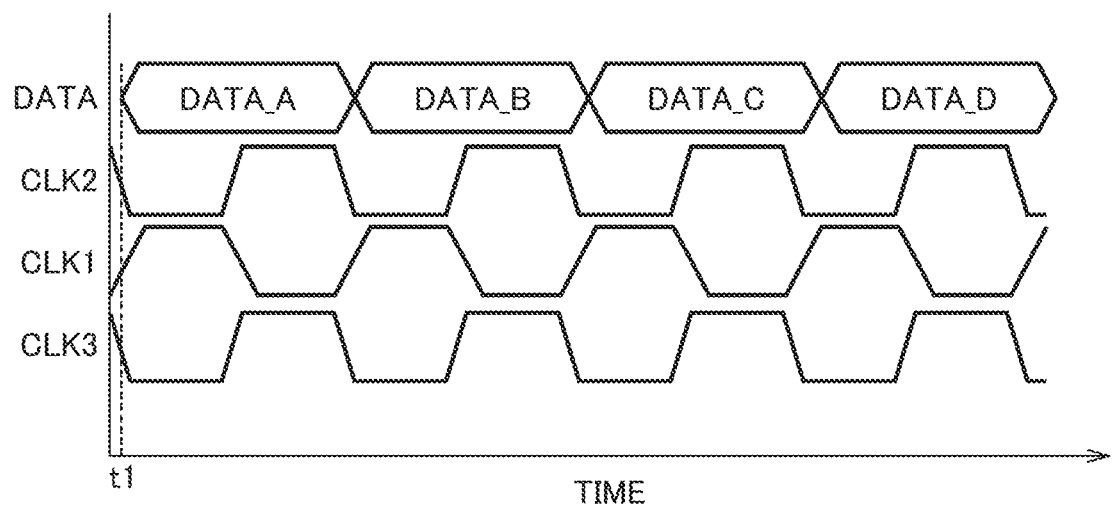
FIG. 24 is a timing chart illustrating an example of a data signal and clock signals at a transmission-side circuit of the semiconductor storage device according to the third embodiment.

In the semiconductor storage device according to the third embodiment, as illustrated in FIG. 24, at the time point t1, the transition timing of the first clock signal CLK1 and the head of the data signal DATA match with each other. Further, the second clock signal CLK2 and the third clock signal CLK3 are reverse-phase with respect to the first clock signal CLK1. With this, as compared to a case in which the driving forces of the first clock driver 511, the second clock driver 512, and the third clock driver 513 are equivalent to one another, the propagation speed of the first clock signal CLK1 propagating through the first clock wiring line 501 is further reduced. When the difference between the first driving force and the second driving force is set appropriately, the transition timing of the first clock signal CLK1 and the head of the data signal of the data wiring line 400 with the lowest propagation speed of the data signal can match with each other at the sense amplifier 31 that receives the data signal. Further, as described with reference to FIG. 14, the clock delay time T1 of the clock delay circuit 71 is set to the time corresponding to the setup time of the sense amplifier 31. With this, when the propagation speed of the data signal is reduced due to an influence of capacitive coupling of both the adjacent data wiring lines and the outer data wiring lines, the setup time can be secured for the data wiring line 400 with the lowest propagation speed of the data signal. As a result, the sense amplifier 31 can accurately capture the data signals of all the data wiring lines 400.

As described above, in the semiconductor storage device according to the third embodiment, the driving force of the second clock driver 512 and the third clock driver 513 is larger than the driving force of the first clock driver 511. Further, the second clock signal CLK2 and the third clock signal CLK3 are reverse-phase with respect to the first clock signal CLK1. With this, according to the semiconductor storage device according to the third embodiment, even when variation in propagation speed of the data signals is caused due to an influence of capacitive coupling with the outer data wiring lines in addition to the adjacent data wiring lines, the data signal can be captured accurately at the reception-side circuit. With regard to the other matters, the third embodiment is substantially the same as the first embodiment, and overlapping description thereof is omitted. For example, the data wiring line 400 and the clock wiring line 500 are equal-length wiring lines, and the width and the mutual interval of the data wiring line 400 and the width and the mutual interval of the width of the clock wiring line 500 are equivalent to each other.

Fourth Embodiment

Figure 25:
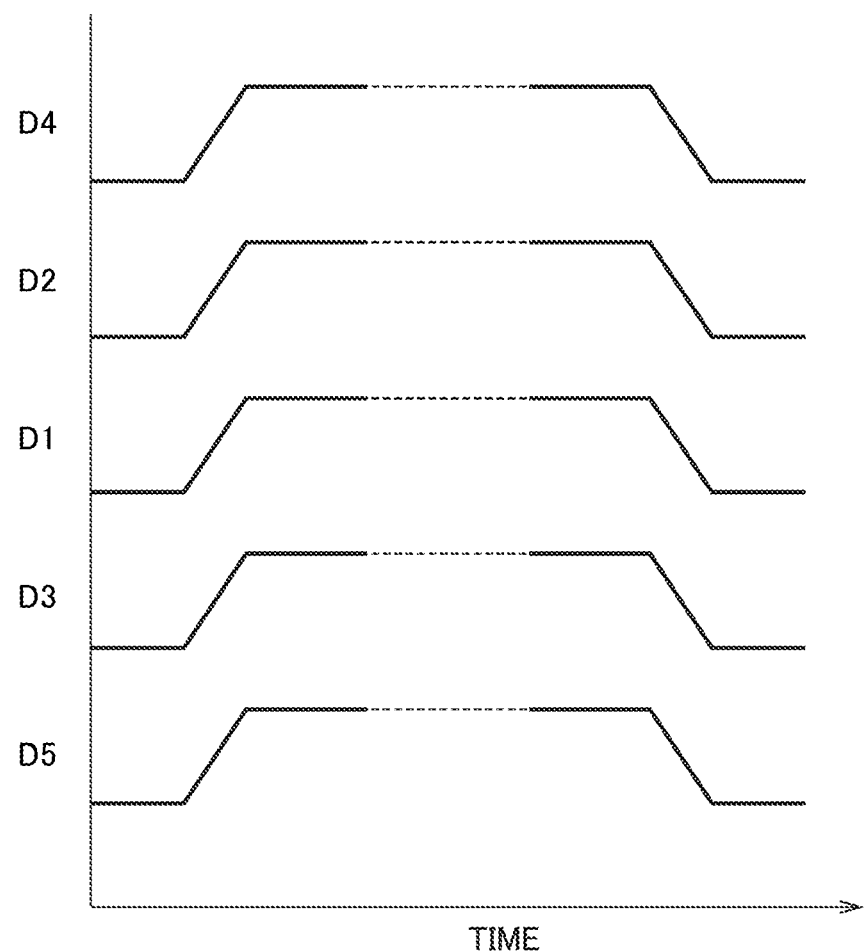
FIG. 25 is a timing chart illustrating an example of changes in data signals on the data wiring lines illustrated in FIG. 21.

In the second embodiment described above, the change of the propagation speed of the data signal due to an influence of capacitive coupling with the adjacent data wiring lines is taken into account. However, it is considered that capacitive coupling between the outer data wiring lines may affect the propagation speed of the data signal on the data wiring line 400. For example, as illustrated in FIG. 25, the first data signal D1, and the second data signal D2, the third data signal D3, the fourth data signal D4, and the fifth data signal D5 are in-phase. In the state illustrated in FIG. 25, the propagation speed of the first data signal D1 is further increased more than a case in which only an influence of capacitive coupling with the adjacent data wiring lines is present.

A semiconductor storage device according to a fourth embodiment includes the clock driver 510 in which driving forces are set in consideration with an influence of capacitive coupling with the outer data wiring lines, in addition to an influence of capacitive coupling with the adjacent data wiring lines.

Figure 26:
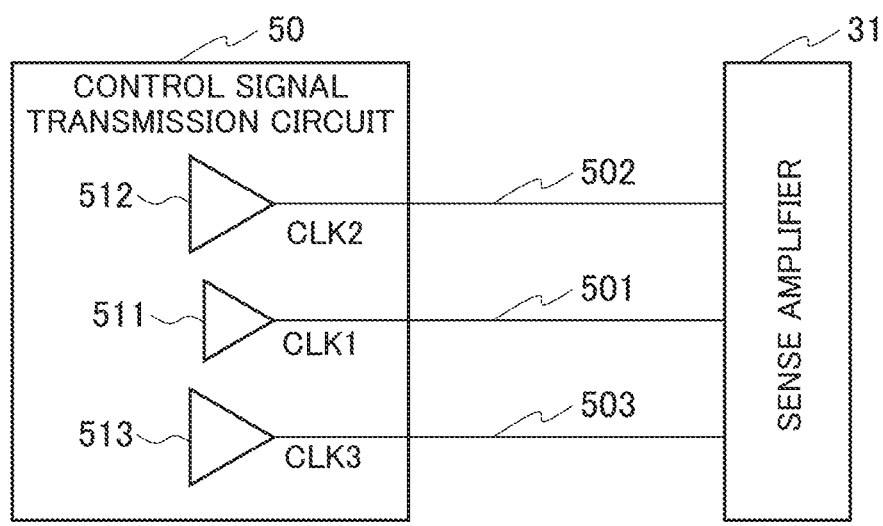
FIG. 26 is a block diagram illustrating a configuration of a control signal transmission circuit of a semiconductor storage device according to a fourth embodiment.

In the control signal transmission circuit 50 of the semiconductor storage device according to the fourth embodiment, which is illustrated in FIG. 26, the second driving force of the second clock driver 512 and the third clock driver 513 is larger than the first driving force of the first clock driver 511. For example, the size of the output transistor that outputs the clock signals of the second clock driver 512 and the third clock driver 513 is larger than the size of the output transistor of the first clock driver 511. With regard to the other configurations, the semiconductor storage device according to the third embodiment is similar to the second embodiment illustrated in FIG. 17. For example, the data multiplexer 31C includes the data delay circuit 72 that delays the data signal transmitted from the input/output circuit 22.

When the driving force of the second clock driver 512 and the third clock driver 513 is increased, rising edge and falling edges of the second clock signal CLK2 and the third clock signal CLK3 are steep. As a result, the propagation speed of the first clock signal CLK1 propagating through the first clock wiring line 501 is changed significantly.

The difference between the first driving force and the second driving force is set in consideration with a difference between an influence of capacitive coupling with the adjacent data wiring lines and an influence of capacitive coupling with both the adjacent wiring lines and the outer data wiring lines. In other words, the second driving force is set so that the change of the propagation speed of the first clock signal CLK1 due to the difference between the first driving force and the second driving force is equivalent to the change of the propagation speed of the data signal due to further addition of capacitive coupling with the outer data wiring lines.

Figure 27:
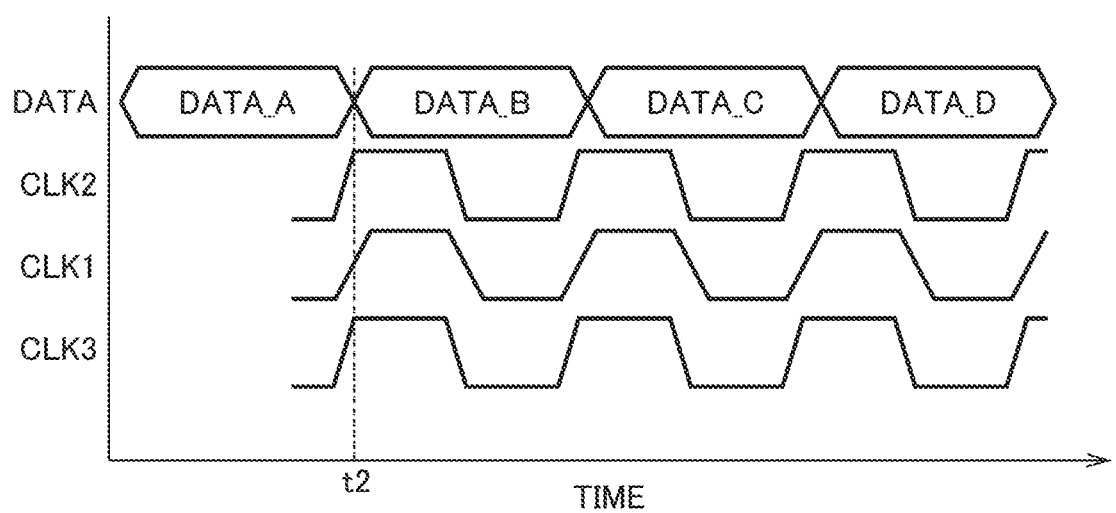
FIG. 27 is a timing chart illustrating an example of a data signal and clock signals at a transmission-side circuit of the semiconductor storage device according to the fourth embodiment.

As illustrated in FIG. 27, at the time point t2, the transition timing of the first clock signal CLK1 and the tail of the data signal DATA match with each other. Further, the second clock signal CLK2 and the third clock signal CLK3 are in-phase with respect to the first clock signal CLK1. With this, as compared to a case in which the driving forces of the first clock driver 511, the second clock driver 512, and the third clock driver 513 are equivalent to one another, the propagation speed of the first clock signal CLK1 propagating through the first clock wiring line 501 can further be increased. When the difference between the first driving force and the second driving force is set appropriately, the transition timing of the first clock signal CLK1 and the tail of the data signal of the data wiring line 400 with the highest propagation speed of the data signal can match with each other at the sense amplifier 31 that receives the data signal. Further, as described with reference to FIG. 20, the data delay time T2 of the data delay circuit 72 is set to the time corresponding to the hold time of the sense amplifier 31. With this, even when the propagation speed of the data signal is increased due to an influence of capacitive coupling of both the adjacent data wiring lines and the outer data wiring lines, the hold time can be secured for the data wiring line 400 with the highest propagation speed of the data signal. As a result, the sense amplifier 31 can accurately capture the data signals of all the data wiring lines 400.

As described above, in the semiconductor storage device according to the fourth embodiment, the driving force of the second clock driver 512 and the third clock driver 513 is larger than the driving force of the first clock driver 511. Further, the first clock signal CLK1, and the second clock signal CLK2 and the third clock signal CLK3 are in-phase. With this, according to the semiconductor storage device according to the fourth embodiment, even when variation in propagation speed of the data signals is caused due to an influence of capacitive coupling with the outer data wiring lines in addition to the adjacent data wiring lines, the data signal can be captured accurately at the reception-side circuit. With regard to the other matters, the fourth embodiment is substantially the same as the second embodiment, and overlapping description thereof is omitted. For example, the data wiring line 400 and the clock wiring line 500 are equal-length wiring lines, and the width and the mutual interval of the data wiring line 400 and the width and the mutual interval of the width of the clock wiring line 500 are equivalent to each other.

Other Embodiment

Figure 28:
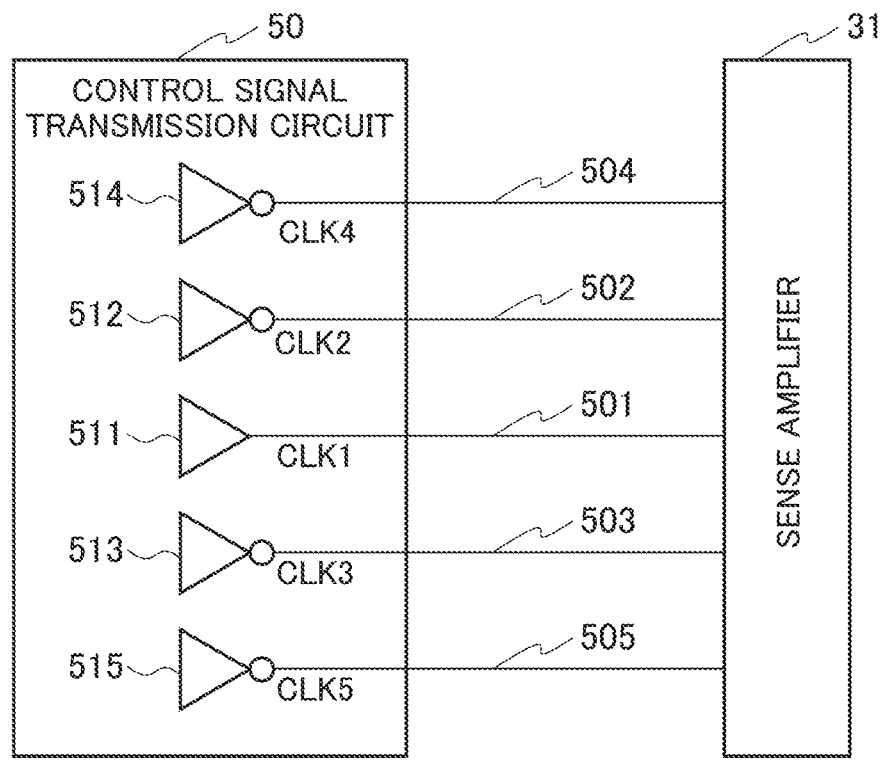
FIG. 28 is a block diagram illustrating an example of a configuration of a control signal transmission circuit of a semiconductor storage device according to other embodiments.
Figure 29:
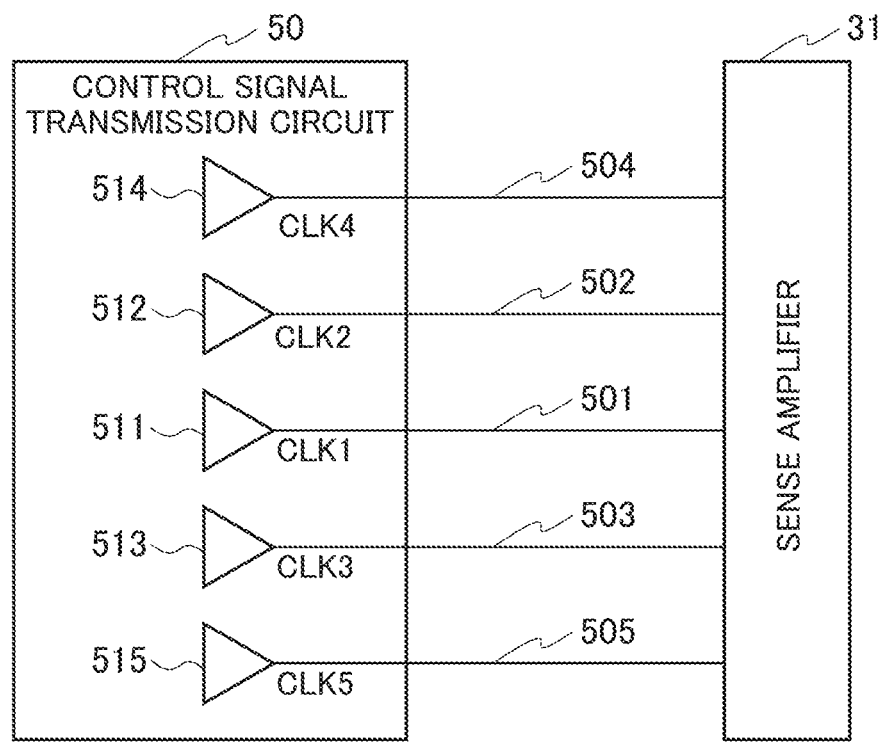
FIG. 29 is a block diagram illustrating another example of the configuration of the control signal transmission circuit of the semiconductor storage device according to the other embodiments.

In the third embodiment and the fourth embodiment, description is made on the semiconductor storage device in which the driving force of the second clock driver 512 and the third clock driver 513 is larger than the driving force of the first clock driver 511, in consideration with an influence of the adjacent data wiring lines and the outer data wiring lines. However, the propagation speed of the first clock signal CLK1 propagating through the first clock wiring line 501 may be adjusted by increasing the number of clock wiring lines having capacitive coupling with the first clock wiring line 501. In other words, as illustrated in FIG. 28 and FIG. 29, as viewed from the first clock wiring line 501, a fourth clock wiring line 504 may be arranged on the outer side of the second clock wiring line 502, and a fifth clock wiring line 505 may be arranged on the outer side of the third clock wiring line 503. The control signal transmission circuit 50 includes the first clock driver 511 to a fifth clock driver 515 that have equivalent driving forces.

In an embodiment illustrated in FIG. 28, the first clock driver 511 outputs the first clock signal CLK1 to the first clock wiring line 501 while matching the transition timing of the first clock signal CLK1 and the head of the data signal with each other. Further, the second clock driver 512 to the fifth clock driver 515 outputs the second clock signal CLK2 to a fifth clock signal CLK5, which are reverse-phase with respect to the first clock signal CLK1, to the second clock wiring line 502 to the fifth clock wiring line 505, respectively. Thus, the propagation speed of the first clock signal CLK1 is reduced, and the transition timing of the first clock signal CLK1 and the head of the data signal having the lowest propagation speed match with each other at the sense amplifier 31. Further, the clock delay time T1 of the clock delay circuit 71 is set to the time corresponding to the setup time of the sense amplifier 31. As a result, even when variation in propagation speed of the data signals is caused due to an influence of capacitive coupling with the adjacent data wiring lines and the outer data wiring lines, the sense amplifier 31 can accurately capture the data signals.

In an embodiment illustrated in FIG. 29, the first clock driver 511 outputs the first clock signal CLK1 to the first clock wiring line 501 while matching the transition timing of the first clock signal CLK1 and the tail of the data signal with each other. Further, the second clock driver 512 to the fifth clock driver 515 outputs the second clock signal CLK2 to the fifth clock signal CLK5, which are in phase with respect to the first clock signal CLK1, to the second clock wiring line 502 to the fifth clock wiring line 505, respectively. Thus, the propagation speed of the first clock signal CLK1 is increased, and the transition timing of the first clock signal CLK1 and the tail of the data signal having the highest propagation speed match with each other at the sense amplifier 31. Further, the data delay time T2 of the data delay circuit 72 is set to the time corresponding to the hold time of the sense amplifier 31. As a result, even when variation in propagation speed of the data signals is caused due to an influence of capacitive coupling with the adjacent data wiring lines and the outer data wiring lines, the sense amplifier 31 can accurately capture the data signals.

Note that, in FIG. 28 and FIG. 29, description is exemplarily made on a case in which the number of clock wiring lines arranged along the first clock wiring line 501 is four including the second clock wiring line 502 to the fifth clock wiring line 505. However, the number of clock wiring lines arranged along the first clock wiring line 501 may be set in conformity with a capacitance value of capacitive coupling affecting the propagation speed of the data signal on the data wiring line.

Further, description is exemplarily made above on the data-in operation during which the sense amplifier 31 receives the signal data propagating through the data bus YIO. However, the embodiment of the present invention is also applicable to the data-out operation during which the input/output circuit 22 receives the data signal output from the sense amplifier 31 to the data bus YIO. For example, the first clock signal CLK1, and the second clock signal CLK2 and the third clock signal CLK3 are reverse-phase, and the transition timing of the first clock signal CLK1 and the head of the data signal match with each other. Further, the clock delay circuit 71 arranged in the input/output circuit 22 delays the first clock signal CLK1. With this, the setup time of the input/output circuit 22 can be secured for the data signal having the lowest propagation speed. As a result, the input/output circuit 22 can accurately capture the data signal. Further, the first clock signal CLK1, and the second clock signal CLK2 and the third clock signal CLK3 are in-phase, and the transition timing of the first clock signal CLK1 and the tail of the data signal match with each other. Further, the data signal received by the input/output circuit 22 is delayed by the data delay circuit 72 arranged in the input/output circuit 22. With this, the hold time of the input/output circuit 22 can be secured for the data signal having the highest propagation speed. As a result, the input/output circuit 22 can accurately capture the data signal.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a memory cell array including a plurality of memory cells;
    a sense amplifier being connected to the memory cell array;
    an input/output circuit;
    a control signal transmission circuit;
    a plurality of data wiring lines for connecting the input/output circuit and the sense amplifier to each other;
    a first clock wiring line being connected to the control signal transmission circuit;
    a second clock wiring line being connected to the control signal transmission circuit, being arranged on one side surface of the first clock wiring line, and extending along the first clock wiring line; and
    a third clock wiring line being connected to the control signal transmission circuit, being arranged on the other side surface of the first clock wiring line, and extending along the first clock wiring line, wherein
    when a data signal is transmitted/received between the input/output circuit and the sense amplifier via the plurality of data wiring lines, the control signal transmission circuit:
        transmits, via the first clock wiring line, a first clock signal having a first phase to a reception-side circuit configured to receive the data signal, while aligning transition timing of the first clock signal and a head of the data signal with each other;
        transmits a second clock signal having a second phase being reverse-phase to the first clock signal, to the second clock wiring line; and
        transmits a third clock signal having the second phase to the third clock wiring line, and
    the reception-side circuit:
        includes a clock delay circuit configured to delay the first clock signal; and
        captures the data signal in response to a delay clock signal that is output from the clock delay circuit.

2. The semiconductor storage device according to claim 1, wherein
    the plurality of data wiring lines are arranged at a data wiring line interval being a first wiring line interval, and each of the data wiring lines has a first wiring line length,
    each of the first clock wiring line, the second clock wiring line, and the third clock wiring line has the first wiring line length, and
    an interval between the first clock wiring line and the second clock wiring line and an interval between the first clock wiring line and the third clock wiring line are the first wiring line interval.

3. The semiconductor storage device according to claim 1, wherein
    the control signal transmission circuit includes:
        a first clock driver configured to output the first clock signal to the first clock wiring line;
        a second clock driver configured to output the second clock signal to the second clock wiring line; and
        a third clock driver configured to output the third clock signal to the third clock wiring line, and
    a driving force for outputting the first clock signal from the first clock driver is equivalent to a driving force for outputting the data signal to the plurality of data wiring lines.

4. The semiconductor storage device according to claim 3, wherein
    a driving force for outputting the second clock signal from the second clock driver and a driving force for outputting the third clock signal from the third clock driver are larger than the driving force for outputting the first clock signal from the first clock driver.

5. A semiconductor storage device comprising:
    a memory cell array including a plurality of memory cells;
    a sense amplifier being connected to the memory cell array;
    an input/output circuit;
    a control signal transmission circuit;

a plurality of data wiring lines for connecting the input/output circuit and the sense amplifier to each other;

a first clock wiring line being connected to the control signal transmission circuit;

a second clock wiring line being connected to the control signal transmission circuit, being arranged on one side surface of the first clock wiring line, and extending along the first clock wiring line; and a third clock wiring line being connected to the control signal transmission circuit, being arranged on the other side surface of the first clock wiring line, and extending along the first clock wiring line, wherein when a data signal is transmitted/received between the input/output circuit and the sense amplifier via the plurality of data wiring lines, the control signal transmission circuit:

transmits, via the first clock wiring line, a first clock signal having a first phase to a reception-side circuit configured to receive the data signal, while aligning transition timing of the first clock signal and a tail of the data signal with each other;

outputs a second clock signal having the first phase to the second clock wiring line; and outputs a third clock signal having the first phase to the third clock wiring line, and the reception-side circuit:

includes a data delay circuit configured to delay the data signal propagating through the plurality of data wiring lines; and captures a delay data signal that is output from the data delay circuit, in response to the first clock signal.

6. The semiconductor storage device according to claim 5, wherein the plurality of data wiring lines are arranged at a data wiring line interval being a first wiring line interval, and each of the data wiring lines has a first wiring line length, each of the first clock wiring line, the second clock wiring line, and the third clock wiring line has the first wiring line length, and an interval between the first clock wiring line and the second clock wiring line and an interval between the first clock wiring line and the third clock wiring line are the first wiring line interval.

7. The semiconductor storage device according to claim 5, wherein the control signal transmission circuit includes:

a first clock driver configured to output the first clock signal to the first clock wiring line;

a second clock driver configured to output the second clock signal to the second clock wiring line; and a third clock driver configured to output the third clock signal to the third clock wiring line, and a driving force for outputting the first clock signal from the first clock driver is equivalent to a driving force for outputting the data signal to the plurality of data wiring lines.

8. The semiconductor storage device according to claim 7, wherein a driving force for outputting the second clock signal from the second clock driver and a driving force for outputting the third clock signal from the third clock driver are larger than the driving force for outputting the first clock signal from the first clock driver.

* * * * *